United States Patent
Park et al.

(10) Patent No.: US 12,191,368 B2
(45) Date of Patent: Jan. 7, 2025

(54) SEMICONDUCTOR DEVICE

(71) Applicant: Samsung Electronics Co., Ltd., Suwon-si (KR)

(72) Inventors: Yonghee Park, Hwaseong-si (KR); Munhyeon Kim, Hwaseong-si (KR); Uihui Kwon, Hwaseong-si (KR); Joohyung You, Seoul (KR); Daewon Ha, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 428 days.

(21) Appl. No.: 17/455,681

(22) Filed: Nov. 19, 2021

(65) Prior Publication Data
US 2022/0285511 A1 Sep. 8, 2022

(30) Foreign Application Priority Data
Mar. 2, 2021 (KR) ........................ 10-2021-0027672

(51) Int. Cl.
| | | |
|---|---|---|
| H01L 29/423 | (2006.01) | |
| H01L 27/088 | (2006.01) | |
| H01L 29/417 | (2006.01) | |
| H01L 29/786 | (2006.01) | |

(52) U.S. Cl.
CPC ...... *H01L 29/42392* (2013.01); *H01L 27/088* (2013.01); *H01L 29/41733* (2013.01); *H01L 29/78696* (2013.01)

(58) Field of Classification Search
CPC ......... H01L 29/42392; H01L 29/41733; H01L 29/78696; H01L 29/1079; H01L 27/088; H01L 21/823412; H01L 21/823418; H01L 21/823475
See application file for complete search history.

(56) References Cited

U.S. PATENT DOCUMENTS

| | | |
|---|---|---|
| 9,608,069 B1 | 3/2017 | Basker et al. |
| 9,673,099 B2 | 6/2017 | Kang et al. |
| 9,847,391 B1 | 12/2017 | Zang et al. |
| 10,658,459 B2 | 5/2020 | Chao et al. |
| 10,699,956 B2 | 6/2020 | Chiang et al. |
| 2017/0005009 A1* | 1/2017 | Pritiskutch ........ H01L 21/26513 |
| 2017/0005106 A1* | 1/2017 | Zhang ................. H01L 29/7827 |
| 2017/0140996 A1 | 5/2017 | Lin et al. |
| 2017/0358500 A1 | 12/2017 | Lin et al. |
| 2018/0294331 A1* | 10/2018 | Cho .................... H01L 29/0649 |

(Continued)

*Primary Examiner* — Fernando L Toledo
*Assistant Examiner* — Marshall Mu-Nuo Hatfield
(74) *Attorney, Agent, or Firm* — Myers Bigel, P.A.

(57) ABSTRACT

A semiconductor device includes active regions extending on a substrate in a first direction, gate structures intersecting the active regions and extending on the substrate in a second direction, source/drain regions in recess regions in which the active regions are recessed, on both sides of each of the gate structures, and contact plugs connected to the source/drain regions, wherein each of the source/drain regions include first and second epitaxial layers sequentially stacked on the active regions in the recess regions in a third direction perpendicular to an upper surface of the substrate, respectively, and wherein ratios of the first epitaxial layer thickness in the third direction to the second epitaxial layer thickness in the third direction are different in different ones of the source/drain regions.

20 Claims, 26 Drawing Sheets

(56) References Cited

U.S. PATENT DOCUMENTS

| | | |
|---|---|---|
| 2019/0115424 A1* | 4/2019 | Park .................. H01L 29/66545 |
| 2019/0131396 A1* | 5/2019 | Zhang ............... H01L 21/02236 |
| 2019/0326288 A1 | 10/2019 | Hashemi et al. |
| 2020/0020774 A1* | 1/2020 | Lee ..................... H01L 29/7848 |
| 2020/0035831 A1* | 1/2020 | Sung ....................... H01L 21/28 |
| 2020/0287046 A1 | 9/2020 | Frougier et al. |
| 2021/0013107 A1* | 1/2021 | Gardner ................ H01L 27/088 |

* cited by examiner

SEMICONDUCTOR DEVICE

CROSS-REFERENCE TO RELATED APPLICATION

This application claims benefit of priority to Korean Patent Application No. 10-2021-0027672 filed on Mar. 2, 2021 in the Korean Intellectual Property Office, the disclosure of which is incorporated herein by reference in its entirety.

BACKGROUND

Embodiments of the present inventive concept relate to a semiconductor device, and, more particularly, to power efficiency of a semiconductor device.

The degree of integration of semiconductor devices has increased in line with growing demand for high performance, high speed, and/or multifunctionality of semiconductor devices. In manufacturing semiconductor devices having a fine pattern corresponding to the trend for high integration, it may be necessary to implement patterns having a fine width or a fine distance. In addition, to overcome operating characteristic limitations due to a reduction in size of planar metal oxide semiconductor field effect transistors (MOSFETs), efforts have been made to develop semiconductor devices including FinFETs having a three-dimensional (3D) channel structure.

SUMMARY

An aspect of the present inventive concept is to provide a semiconductor device having improved power efficiency.

According to an aspect of the present inventive concept, a semiconductor device includes active regions extending on a substrate in a first direction, first and second gate structures intersecting the active regions and extending on the substrate in a second direction, a plurality of channel layers spaced apart from each other in a third direction, perpendicular to an upper surface of the substrate, on the active regions and surrounded in the second and third directions by the first and second gate structures, first and second source/drain regions in recess regions in which the active regions are recessed on at least one side of each of the first and second gate structures, and physically contacting the plurality of channel layers, and contact plugs connected to the first and second source/drain regions, wherein each of the first and second source/drain regions includes a first epitaxial layer on each of the active regions in each of the recess regions, and a second epitaxial layer on the first epitaxial layer and including first conductivity-type impurities, the first epitaxial layer has a first thickness in the third direction in the first source/drain region, and the first epitaxial layer has a second thickness less than the first thickness in the third direction in the second source/drain region.

According to an aspect of the present inventive concept, a semiconductor device includes active regions extending on a substrate in a first direction, gate structures intersecting the active regions and extending on the substrate in a second direction, source/drain regions in recess regions in which the active regions are recessed, on both sides of each of the gate structures, and contact plugs connected to the source/drain regions, wherein each of the source/drain regions include first and second epitaxial layers sequentially stacked on the active regions in the recess regions in a third direction perpendicular to an upper surface of the substrate, respectively, wherein ratios of the first epitaxial layer thickness in the third direction to the second epitaxial layer thickness in the third direction are different in different ones of the source/drain regions.

According to an aspect of the present inventive concept, a semiconductor device includes active regions extending on a substrate in a first direction, gate structures intersecting the active regions and extending on the substrate in a second direction, a plurality of channel layers spaced apart from each other in a third direction, perpendicular to an upper surface of the substrate, on the active regions and surrounded in the second and third directions by the gate structures, and source/drain regions in recess regions in which the active regions are recessed on at least one side of each of the gate structures, wherein the source/drain regions include first and second epitaxial layers sequentially stacked on the active regions in the recess regions in the third direction, respectively, wherein the source/drain regions include a first source/drain region in which the second epitaxial layer is at a first depth and a second source/drain region in which the second epitaxial layer is at a second depth different from the first depth, wherein the sums of thicknesses of the first and second epitaxial layers in the third direction in the first and second source/drain regions are substantially equal.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination. Hereinafter, example embodiments of the present inventive concept will be described with reference to the accompanying drawings.

Figure 1:
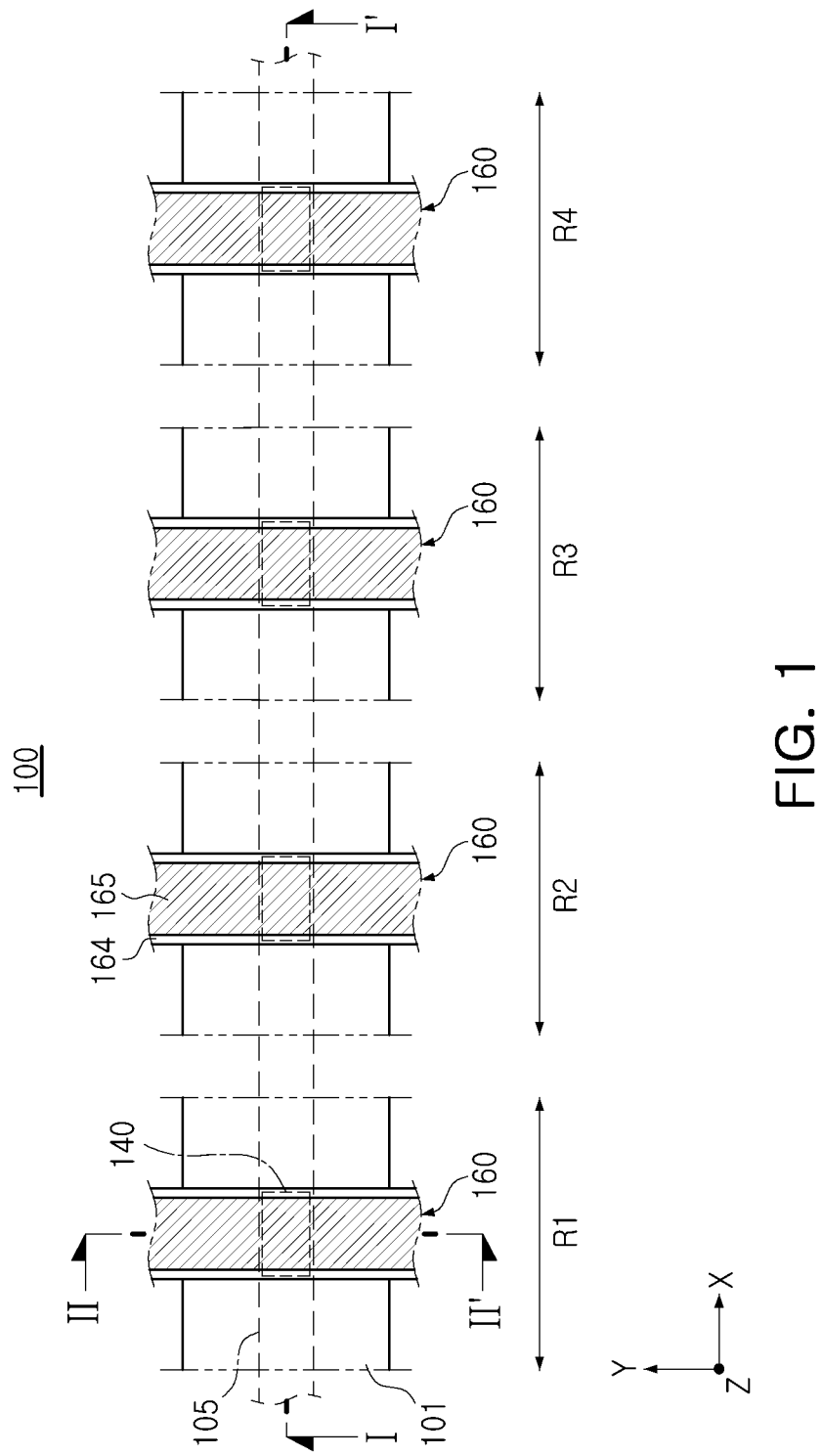
FIG. 1 is a plan view illustrating a semiconductor device according to example embodiments.

FIG. 1 is a plan view illustrating a semiconductor device according to example embodiments.

Figure 2A:
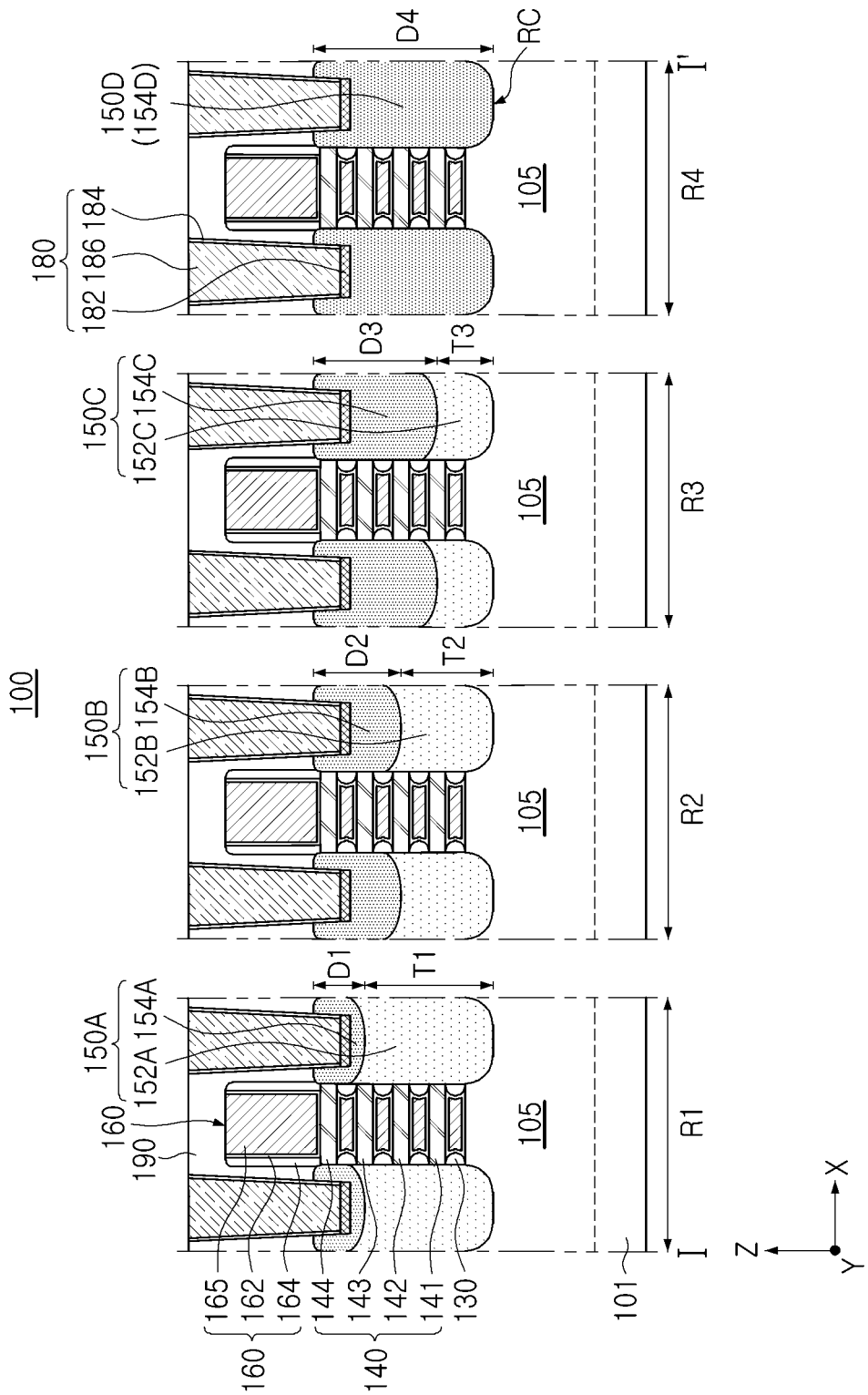
FIGS. 2A and 2B are cross-sectional views illustrating semiconductor devices according to example embodiments.
Figure 2B:
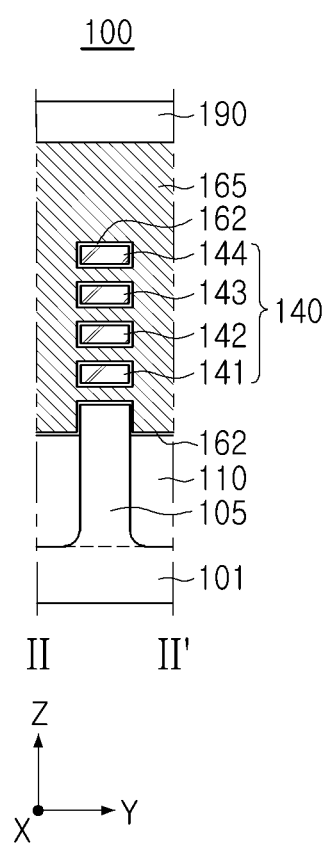

FIGS. 2A and 2B are cross-sectional views illustrating semiconductor devices according to example embodiments. FIGS. 2A and 2B illustrate cross-sections of the semiconductor device of FIG. 1, taken along lines I-I' and II-II'. For convenience of description, only some components of the semiconductor device are illustrated in FIG. 1.

Referring to FIGS. 1 to 2B, the semiconductor device 100 may include a substrate 101 having first to fourth regions R1, R2, R3, and R4, active regions 105 on the substrate 101, channel structures 140 including a plurality of channel layers 141, 142, 143, and 144 disposed on the active regions 105 and vertically (i.e., in the Z direction) spaced apart from each other, gate structures 160 extending to intersect the active regions 105, source/drain regions 150A, 150B, 150C, and 150D physically contacting the plurality of channel layers 141, 142, 143, and 144, and contact plugs 180 connected to the source/drain regions 150A, 150B, 150C, and 150D. The semiconductor device 100 may further include a device isolation layer 110, internal spacer layers 130, and an interlayer insulating layer 190. The gate structure 160 may include a gate dielectric layer 162, a gate electrode 165, and spacer layers 164.

In the semiconductor device 100, the active region 105 has a fin structure, and the gate electrode 165 may be disposed between the active region 105 and the channel structure 140, between the plurality of channel layers 141, 142, 143, and 144 of the channel structures 140, and above the channel structure 140 in the Z direction. Accordingly, the semiconductor device 100 may include a transistor having a multi-bridge channel field effect transistor FET (MBCFET™) structure, which is a gate-all-around FET.

The substrate 101 may have an upper surface extending in the X direction and the Y direction. The substrate 101 may include a semiconductor material, for example, a group IV semiconductor, a group III-V compound semiconductor, or a group II-VI compound semiconductor. For example, the group IV semiconductor may include silicon, germanium, or silicon-germanium. The substrate 101 may be provided as a bulk wafer, an epitaxial layer, a silicon on insulator (SOI) layer, a semiconductor on insulator (SeOI) layer, or the like. The first to fourth regions R1, R2, R3, and R4 of the substrate 101 may be adjacent to or spaced apart from each other.

The device isolation layer 110 may define the active region 105 in the substrate 101. The device isolation layer 110 may be formed by, for example, a shallow trench isolation (STI) process. In some embodiments, the device isolation layer 110 may further include a region having a step difference to a lower portion of the substrate 101 and extending more deeply. The device isolation layer 110 may expose an upper surface of the active region 105, and may partially expose an upper portion of the active region 105 according to embodiments. In example embodiments, the device isolation layer 110 may have a curved upper surface that has a higher level in a direction toward the active region 105. The device isolation layer 110 may be formed of an insulating material. The device isolation layer 110 may be, for example, oxide, nitride, or a combination thereof.

The active regions 105 are defined by the device isolation layer 110 in the substrate 101 and may be disposed to extend in a first direction, for example, an X direction. The active regions 105 may have a structure protruding from the substrate 101. In some embodiments, upper ends of the active regions 105 may be disposed to protrude to a predetermined height from the upper surface of the device isolation layer 110. The active regions 105 may be formed as a portion of the substrate 101 or may include an epitaxial layer grown from the substrate 101. However, on both sides of the gate structures 160, the active regions 105 may be partially recessed to form recess regions RC, and the source/drain regions 150A, 150B, 150C, and 150D may be respectively disposed in the recess regions RC.

In example embodiments, the active regions 105 may include an impurity region. The impurity region may correspond to a well region of a transistor. Accordingly, in the case of a p-type transistor (pFET), the impurity region may include n-type impurities such as phosphorus (P), arsenic (As), or antimony (Sb), and in the case of an n-type transistor (nFET), the impurity region may include p-type impurities such as boron (B), gallium (Ga), or aluminum (Al). The impurity region may be positioned at a predetermined depth from the upper surfaces of the active regions 105 and the substrate 101.

The channel structures 140 may include two or more channel layers, for example, first to fourth channel layers 141, 142, 143, and 144, disposed on the active regions 105 and spaced apart from each other in a direction perpendicular to an upper surface of the active regions 105, for example, in the Z direction. The first to fourth channel layers 141, 142, 143, and 144 may be spaced apart from the upper surface of the active region 105, while being connected to the source/drain regions 150A, 150B, 150C, and 150D. The first to fourth channel layers 141, 142, 143, and 144 may have the same or similar width as the active region 105 in the Y direction and may have the same or similar width as the gate structure 160 in the X direction. In some embodiments, the first to fourth channel layers 141, 142, 143, and 144 may have reduced widths so that side surfaces thereof are positioned under the gate structure 160 in the X direction.

The first to fourth channel layers 141, 142, 143, and 144 may be formed of a semiconductor material and may include, for example, at least one of silicon (Si), silicon germanium (SiGe), and germanium (Ge). The first to fourth channel layers 141, 142, 143, and 144 may be formed of, for example, the same material as the substrate 101. In some embodiments, the first to fourth channel layers 141, 142, 143, and 144 may include impurity regions positioned in regions adjacent to the source/drain regions 150A, 150B, 150C, and 150D. The number and shape of the channel layers 141, 142, 143, and 144 constituting one channel structure 140 may be variously changed in embodiments. For example, in some embodiments, the channel structure 140 may further include a channel layer disposed on an upper surface of the active region 105.

The source/drain regions 150A, 150B, 150C, and 150D may be disposed at both sides of the gate structures 160 and the channel structures 140 on the active regions 105, respectively. The source/drain regions 150A, 150B, 150C, and 150D may be disposed to be on and at least partially cover the side surfaces of the first to fourth channel layers 141, 142, 143, and 144 of the channel structure 140 and the upper surfaces of the active regions 105. The source/drain regions 150A, 150B, 150C, and 150D may be disposed in the recess regions RC in which the upper portions of the active regions 105 are partially recessed. The upper surfaces of the source/drain regions 150A, 150B, 150C, and 150D may be located at the same height as or similar to that of lower surfaces of the gate structures 160 in the Z direction and may be variously changed in embodiments. According to embodiments, the source/drain regions 150A, 150B, 150C, and 150D are connected to or merged with each other on two or more active regions 105 adjacent in the Y direction to form the source /drain regions 150A, 150B, 150C, and 150D, respectively.

The source/drain regions 150A, 150B, 150C, and 150D may include first to fourth source/drain regions 150A, 150B, 150C, and 150D disposed in the first to fourth regions R1, R2, R3 and R4 of the substrate 101, respectively, and the first to fourth source/drain regions 150A, 150B, 150C, and 150D may constitute different transistors. The first to fourth source/drain regions 150A, 150B, 150C, and 150D may be disposed at both sides of different gate structures 160 and may be disposed to have a symmetrical structure based on the gate structures 160. Accordingly, the source/drain regions 150A, 150B, 150C, and 150D at both sides of one gate structure 160 may have the same structure.

The source/drain regions 150A, 150B, 150C, and 150D may include first epitaxial layers 152A, 152B, and 152C and second epitaxial layers 154A, 154B, 154C, and 154D stacked in a direction perpendicular to the upper surface of the substrate 101, for example, in the Z direction. Specifically, the first source/drain region 150A may include a first epitaxial layer 152A and a second epitaxial layer 154A, the second source/drain region 150B may include a first epitaxial layer 152B and a second epitaxial layer 154B, the third source/drain region 150C may include a first epitaxial layer 152C and a second epitaxial layer 154C, and the fourth source/drain region 150D may include only a second epitaxial layer 154D without the first epitaxial layer.

In the source/drain regions 150A, 150B, 150C, and 150D, the recess regions RC may have substantially the same depth. "Substantially the same" means the same or a case in which there is a difference in the range of deviations occurring during a manufacturing process, and even when the expression "substantially" is omitted, it may be interpreted as having the same meaning. Upper surfaces or upper ends of the source/drain regions 150A, 150B, 150C, and 150D may be positioned at substantially the same height level in the Z direction as each other, and lower surfaces or lower ends of the source/drain regions 150A, 150B, 150C, and 150D may also be positioned on substantially the same height level in the Z direction.

The source/drain regions 150A, 150B, 150C, and 150D may have substantially the same or uniform thickness in the Z direction as each other. In the source/drain regions 150A, 150B, 150C, and 150D, the sum of the thickness of the first epitaxial layers 152A, 152B, and 152C and the second epitaxial layers 154A, 154B, 154C, and 154D, respectively, may be substantially equal to each other. However, in the source/drain regions 150A, 150B, 150C, and 150D, relative thicknesses and depths of the first epitaxial layers 152A, 152B, and 152C and the second epitaxial layers 154A, 154B, 154C, and 154D in the Z direction may be different from each other. Accordingly, in the source/drain regions 150A, 150B, 150C, and 150D, thickness ratios of the first epitaxial layers 152A, 152B, and 152C to the second epitaxial layers 154A, 154B, 154C, and 154D, respectively, may be different.

The first epitaxial layer 152A has a first thickness T1 in the first source/drain region 150A, the first epitaxial layer 152B has a second thickness T2 less than the first thickness T1 in the second source/drain region 150B, the first epitaxial layer 152C has a third thickness T3 less than the second thickness T2 in the third source/drain region 150C, and the fourth source/drain region 150D may not include the first epitaxial layer. In FIG. 2A, the thicknesses are indicated as thicknesses in central regions based on the Z direction, but the above description may be equally applied to an average thickness, a minimum thickness, and a maximum thickness.

Also, the second epitaxial layer 154A may have a first depth D1 from an upper surface of the first source/drain region 150A, the second epitaxial layer 154B may have a second depth D2 greater than the first depth D1 in the second source/drain region 150B, the second epitaxial layer 154C may have a third depth D3 greater than the second depth D2 in the third source drain region 150C, and the second epitaxial layer 154D may have a fourth depth D4 greater than the third depth D3 in the fourth source/drain region 150D. In FIG. 2A, the depths are indicated as depths in the central regions based on the Z direction, but the above description may be equally applied to an average depth, a minimum depth, and a maximum depth.

In the source/drain regions 150A, 150B, 150C, and 150D, the number of channel layers 141, 142, 143, and 144 connected to the second epitaxial layers 154A, 154B, 154C, and 154D thereon may be different. In the first source/drain region 150A, the uppermost fourth channel layer 144 may be connected to the second epitaxial layer 154A, and the lower first to third channel layers 141, 142, and 143 may be connected to the first epitaxial layer 152A. In the second source/drain region 150B, the upper third and fourth channel layers 143 and 144 may be connected to the second epitaxial layer 154B, and the lower first and second channel layers 141 and 142 may be connected to the first epitaxial layer 152B. In the third source/drain region 150C, the upper second to fourth channel layers 142, 143, and 144 may be connected to the second epitaxial layer 154C, and the lower first channel layer 141 may be connected to the first epitaxial layer 152C. In the fourth source/drain region 150D, all of the first to fourth channel layers 141, 142, 143, and 144 may be connected to the second epitaxial layer 154D. The second epitaxial layers 154A, 154B, 154C, and 154D may be on and at least partially cover all side surfaces of the connected channel layers 141, 142, 143, and 144 in the X direction and may be spaced apart from unconnected channel layers 141, 142, 143, and 144.

The first epitaxial layers 152A, 152B, and 152C and the second epitaxial layers 154A, 154B, 154C, and 154D may all include an epitaxially grown semiconductor material, for example, at least one of silicon (Si), silicon germanium (SiGe), and/or silicon carbide (SiC). The first epitaxial layers 152A, 152B, and 152C and the second epitaxial layers 154A, 154B, 154C, and 154D may include different conductivity type of semiconductors. The first epitaxial layers 152A, 152B, and 152C and the second epitaxial layers 154A, 154B, 154C, and 154D may include different conductivity types of impurities or doping elements. For example, the first epitaxial layers 152A, 152B, and 152C may include the same first conductivity-type impurities as that of the active region 105, and the second epitaxial layers 154A, 154B, 154C, and 154D may include second conductivity-type impurities different from that of the active region 105. The first epitaxial layers 152A, 152B, and 152C may be layers doped with the first conductivity type impurity, and the second epitaxial layers 154A, 154B, 154C, and 154D may be layers that are not doped with the first conductivity type impurity but instead are doped with the second conductivity type impurity. However, in example embodiments, the first epitaxial layers 152A, 152B, and 152C may include a small amount of the second conductivity-type impurities diffused from the second epitaxial layers 154A, 154B, 154C, and 154D, and the second epitaxial layers 154A, 154B, 154C, and 154D may further include a small amount of the first conductivity-type impurities diffused from the first epitaxial layers 152A, 152B, and 152C.

The first epitaxial layers 152A, 152B, and 152C may include p-type impurities such as boron (B), gallium (Ga), and/or aluminum (Al) in the case of an nFET, and may include n-type impurities such as phosphorus (P), arsenic (As), or antimony (Sb) in the case of a pFET. The first epitaxial layers 152A, 152B, and 152C may be, for example, at least one of Si:P, Si:As, Si:B, and Si:Ga. In this case, the first epitaxial layers 152A, 152B, and 152C may function, for example, as a punch through stopper of the transistor. Conversely, the second epitaxial layers 154A, 154B, 154C, and 154D may include n-type impurities such as phosphorus (P), arsenic (As), and/or antimony (Sb) in the case of the nFET, and may include p-type impurities such as boron (B), gallium (Ga), or aluminum (Al) in the case of the pFET. The second epitaxial layers 154A, 154B, 154C, and 154D may be, for example, at least one of Si:P, Si:As, SiGe:B, and/or SiGe:Ga. The second epitaxial layers 154A, 154B, 154C, and 154D may substantially function as a source/drain of the transistor.

A first concentration of the first conductivity-type impurities in the first epitaxial layers 152A, 152B, and 152C may be lower than a second concentration of the second conductivity-type impurities in the second epitaxial layers 154A, 154B, 154C, and 154D. For example, the second concentration may be about 5 times to about 15 times higher than the first concentration. The first concentration may range from about $1 \times 10^{17}/cm^3$ to about $1 \times 10^{20}/cm^3$, and the second concentration may range from about $1 \times 10^{18}/cm^3$ to about $1 \times 10^{21}/cm^3$.

In the semiconductor device 100, when the number of the channel layers 141, 142, 143, and 144 stacked to secure current increases, parasitic capacitance may increase to increase power consumption. However, in the present embodiments, while the plurality of channel layers 141, 142, 143, and 144 are stacked, the first to fourth source/drain regions 150A, 150B, 150C, and 150D having the second epitaxial layers 154A, 154B, 154C, and 154D having different depths are configured according to the characteristics of the transistor, thereby improving power efficiency.

The gate structures 160 may intersect the active regions 105 and the channel structures 140 on top of the active regions 105 and the channel structures 140 and extend in a second direction, for example, in the Y direction. Channel regions of the transistors may be formed in the active regions 105 and/or the channel structures 140 intersecting the gate electrode 165 of the gate structure 160.

The gate structure 160 may include a gate electrode 165, a gate dielectric layer 162 between the gate electrode 165 and the plurality of channel layers 141, 142, 143, and 144, and gate spacer layers 164 on the sides of the gate electrode 165. In example embodiments, the gate structure 160 may further include a capping layer on an upper surface of the gate electrode 165. In other embodiments, a portion of the interlayer insulating layer 190 on the gate structure 160 may be referred to as a gate capping layer.

The gate dielectric layer 162 may be disposed between the active region 105 and the gate electrode 165 and between the channel structure 140 and the gate electrode 165, and may be disposed to be on and at least partially cover at least some of the surfaces of the gate electrode 165. For example, the gate dielectric layer 162 may be disposed to border or surround all surfaces of the gate electrode 165, except the uppermost surface thereof. The gate dielectric layer 162 may extend between the gate electrode 165 and the spacer layers 164, but embodiments are not limited thereto. The gate dielectric layer 162 may include oxide, nitride, or a high-k material. The high-k material may refer to a dielectric material having a higher dielectric constant than that of a silicon oxide layer ($SiO_2$). The high dielectric constant material may be any one of, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide (ZrSixOy), hafnium oxide ($HfO_2$), hafnium silicon oxide (HfSixOy), lanthanum oxide ($La_2O_3$), lanthanum aluminum oxide (LaAlxOy), lanthanum hafnium oxide (LaHfxOy), hafnium aluminum oxide (HfAlxOy), and/or praseodymium oxide ($Pr_2O_3$). In some embodiments, the gate dielectric layer 162 may be formed of a multilayer film.

The gate electrode 165 may be disposed on the active region 105, at least partially fill portions between the plurality of channel layers 141, 142, 143, and 144, and extend upward from the channel structure 140. The gate electrode 165 may be spaced apart from the plurality of channel layers 141, 142, 143, and 144 by the gate dielectric layer 162. The gate electrode 165 may include a conductive material, for example, a metal nitride such as titanium nitride (TiN), tantalum nitride (TaN), or tungsten nitride (WN), and/or metal such as aluminum (Al), tungsten. (W), or molybdenum (Mo), or a semiconductor material such as doped polysilicon. In some embodiments, the gate electrode 165 may be formed of two or more multi-layers.

The gate spacer layers 164 may be disposed on both sides of the gate electrode 165. The gate spacer layers 164 may insulate the source/drain regions 150A, 150B, 150C, and 150D from the gate electrodes 165. The gate spacer layers 164 may have a multi-layer structure according to some embodiments. The gate spacer layers 164 may be formed of oxide, nitride, or oxynitride, and in particular, a low-k film.

The internal spacer layers 130 may be disposed in parallel with the gate electrode 165 between the channel structures 140. The gate electrode 165 may be stably spaced apart and electrically separated from the source/drain regions 150A, 150B, 150C, and 150D by the internal spacer layers 130. Side surfaces of the internal spacer layers 130 may be rounded to be inwardly convex toward the gate electrode 165, but embodiments are not limited thereto. The internal spacer layers 130 may be formed of oxide, nitride, or oxynitride, and in particular, a low-k film. However, in some embodiments, the internal spacer layers 130 may be omitted.

The contact plugs 180 may be connected to the source/drain regions 150A, 150B, 150C, and 150D through the interlayer insulating layer 190 and may apply an electrical signal to the source/drain regions 150A, 150B, 150C, 150D. The contact plugs 180 may be particularly connected to the second epitaxial layers 154A, 154B, 154C, and 154D of the source/drain regions 150A, 150B, 150C, and 150D.

The contact plugs 180 may have inclined side surfaces in which a lower width is less than an upper width according to an aspect ratio, but embodiments are not limited thereto. The contact plugs 180 may extend, from above, for example, to below a lower surface of the fourth channel layer 144, but embodiments are not limited thereto. In example embodiments, the contact plugs 180 may be disposed to be in physical contact with upper surfaces of the source/drain regions 150A, 150B, 150C, and 150D without recessing the source/drain regions 150A, 150B, 150C, and 150D.

The contact plugs 180 may include a metal-semiconductor compound layer 182 disposed at a lower end, a barrier layer 184 disposed along sidewalls, and a plug conductive layer 186. The metal-semiconductor compound layer 182 may be, for example, a metal silicide layer. The barrier layer 184 may include, for example, a metal nitride such as a titanium nitride layer (TiN), a tantalum nitride layer (TaN), and/or a tungsten nitride layer (WN). The plug conductive layer 186 may include, for example, a metal material, such as aluminum (Al), tungsten (W), and/or molybdenum (Mo). In example embodiments, the number and arrangement of conductive layers constituting the contact plugs 180 may be variously changed.

The interlayer insulating layer 190 may be disposed to be on and at least partially cover the source/drain regions 150A, 150B, 150C, and 150D and the gate structures 160, and to be on and at least partially cover the device isolation layer 110. The interlayer insulating layer 190 may include at least one of oxide, nitride, and oxynitride, and may include, for example, a low-k material. In some embodiments, the interlayer insulating layer 190 may include a plurality of insulating layers.

Figure 3:
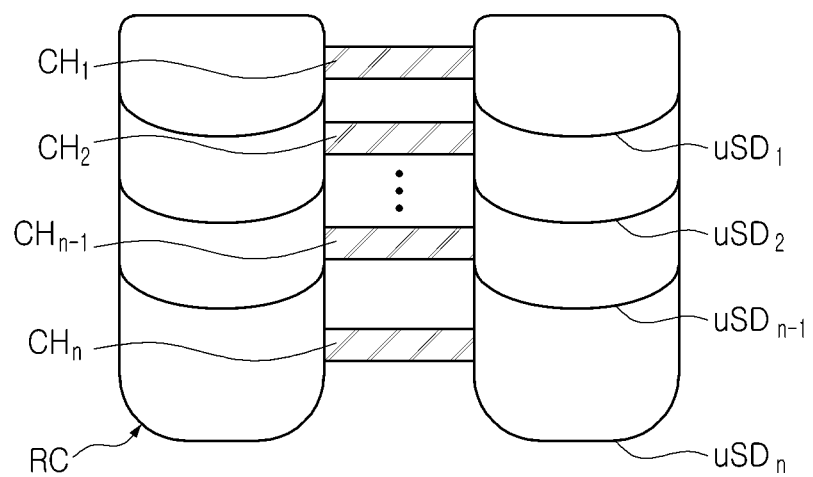
FIG. 3 is a view illustrating a semiconductor device according to example embodiments.

FIG. 3 is a view illustrating a semiconductor device according to example embodiments.

Referring to FIG. 3, n channel layers $CH_1$, $CH_2$, $CH_{n-1}$, and $CH_n$ and n upper source/drain regions $uSD_1$, $uSD_2$, $uSD_{n-1}$, and $uSD_n$ of a semiconductor device are illustrated. Here, n may be a natural number of 2 or greater. The channel layers $CH_1$, $CH_2$, $CH_{n-1}$, and $CH_n$ correspond to the channel structure 140 of FIGS. 1 to 2B, and the upper source/drain regions uSD1 $uSD_1$, $uSD_2$, $uSD_{n-1}$, and $uSD_n$ may correspond to the second epitaxial layers 154A, 154B, 154C, and 154D.

The number of the channel layers $CH_1$, $CH_2$, $CH_{n-1}$, and $CH_n$ may be selected from a variety of numbers within the range of two or greater. The upper source/drain regions $uSD_1$, $uSD_2$, $uSD_{n-1}$, and $uSD_n$ may be disposed to form an upper surface of the entire source/drain regions in the recess regions RC having a constant size. When the number of channel layers is n, the upper source/drain regions $uSD_1$, $uSD_2$, $uSD_{n-1}$, and $uSD_n$ may have n depths or thicknesses in different regions as shown in an overlapping manner in FIG. 3.

In the upper source/drain regions $uSD_1$, $uSD_2$, $uSD_{n-1}$, and $uSD_n$, the degree to which depths increase from the thinnest first upper source/drain region uSD1 to the deepest n-th source/drain region $uSD_n$ may or may not be constant. For example, except for the n-th upper source/drain regions $uSD_n$, the other upper source/drain regions $uSD_1$, $uSD_2$, and $uSD_{n-1}$ may be deepened by a substantially constant depth difference as the number of connected channel layers increases. This is because the channel layers $CH_1$, $CH_2$, $CH_{n-1}$, and $CH_n$ are disposed to be spaced apart from each other at regular intervals.

Figure 4:
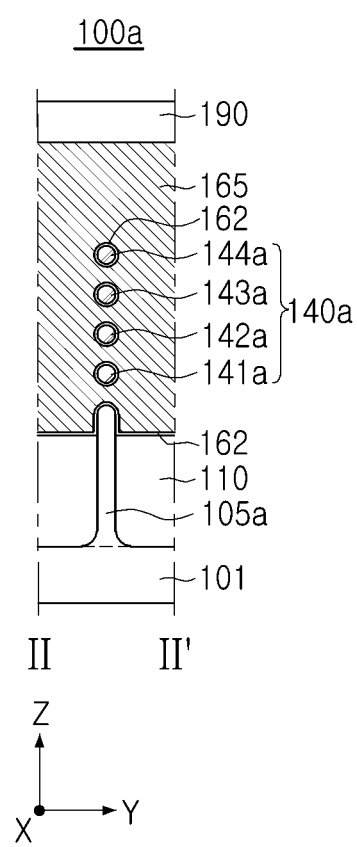
FIG. 4 is a cross-sectional view illustrating a semiconductor device according to example embodiments.

FIG. 4 is a cross-sectional view illustrating a semiconductor device according to example embodiments. FIG. 4 illustrates a region corresponding to FIG. 2B. Hereinafter, descriptions overlapping with those described above with reference to FIGS. 1 to 2B will be omitted.

Referring to FIG. 4, in a semiconductor device 100a, widths of an active region 105a and a channel structure 140a may be different from those in the embodiment of FIG. 2B. In present embodiment, the active region 105a and the channel structure 140a may have a relatively small width, and accordingly, the plurality of channel layers 141a, 142a, 143a, and 144a of the channel structure 140a may each have a circular shape or an elliptical shape with a small difference between the lengths of the major axis and the minor axis in a cross-section along the Y direction. For example, in the embodiment of FIG. 2B, the plurality of channel layers 141, 142, 143, and 144 may have a width of about 15 nm to about 50 nm along the Y direction, and the plurality of channel layers 141a, 142a, 143a, and 144a of present embodiment may have a width of about 1 nm to about 15 nm along the Y direction. As such, in embodiments, the width and corresponding shape of the active region 105a and the channel structure 140a may be variously changed.

Figure 5:
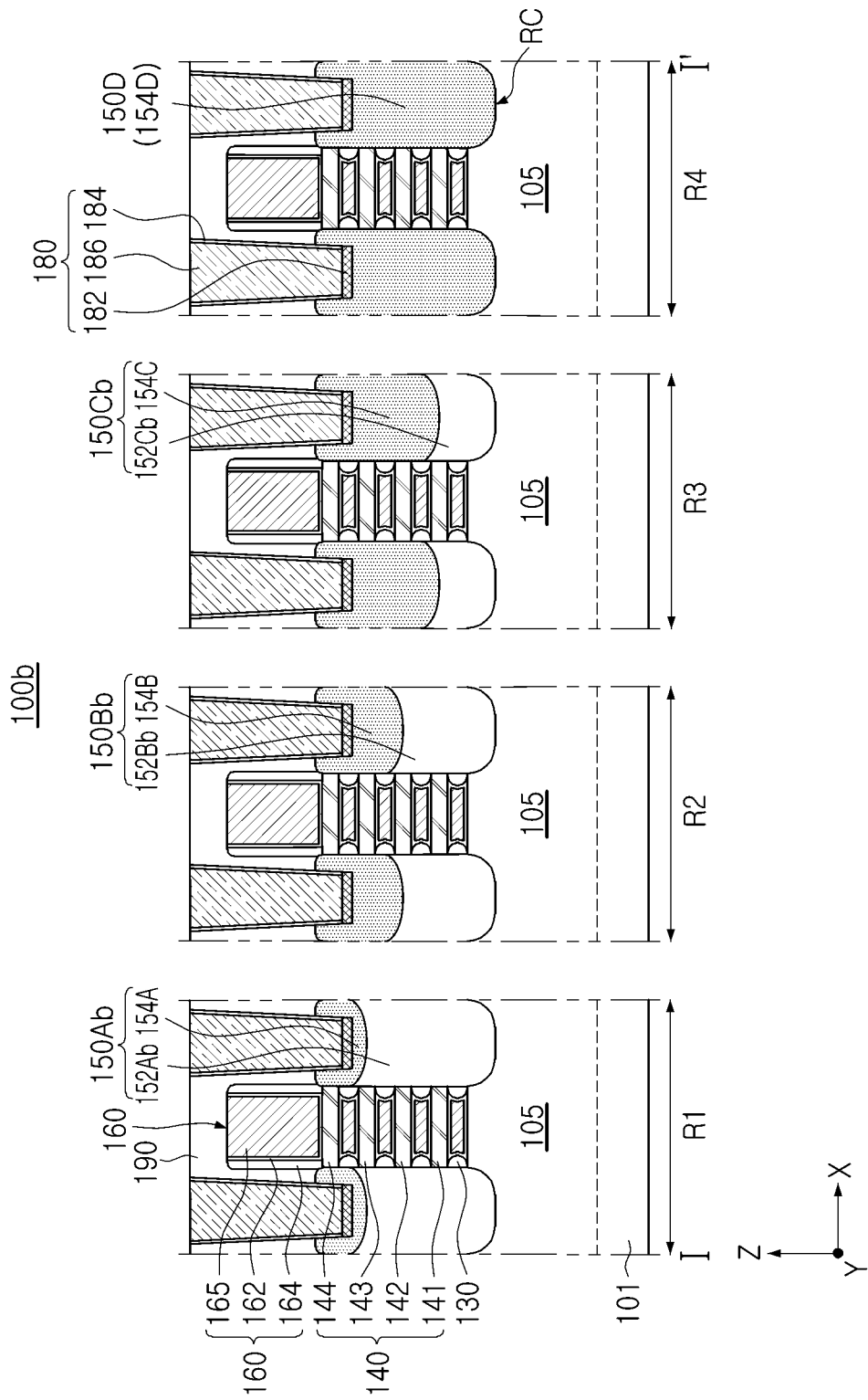
FIG. 5 is a cross-sectional view illustrating a semiconductor device according to example embodiments.

FIG. 5 is a cross-sectional view illustrating a semiconductor device according to example embodiments. FIG. 5 illustrates a region corresponding to FIG. 2A.

Referring to FIG. 5, in the semiconductor device 100b, the first epitaxial layers 152Ab, 152Bb, and 152Cb of the source/drain regions 150Ab, 150Bb, 150Cb, and 150Db may include an insulating material. For example, the first epitaxial layers 152Ab, 152Bb, and 152Cb may be formed of an insulating material without a semiconductor material. The first epitaxial layers 152Ab, 152Bb, and 152Cb may include, for example, at least one of silicon oxide, silicon nitride, and silicon oxynitride. Also, in this case, the first epitaxial layers 152Ab, 152Bb, and 152Cb may be layers epitaxially grown from the active region 105 and may be, for example, a single crystal layer. The first epitaxial layers 152Ab, 152Bb, and 152Cb may function as a seed layer when the second epitaxial layers 154A, 154B, and 154C are grown. Accordingly, in consideration of resistance of the second epitaxial layers 154A, 154B, and 154C, the first epitaxial layers 152Ab, 152Bb, and 152Cb may be formed as single crystal layers.

Figure 6A:
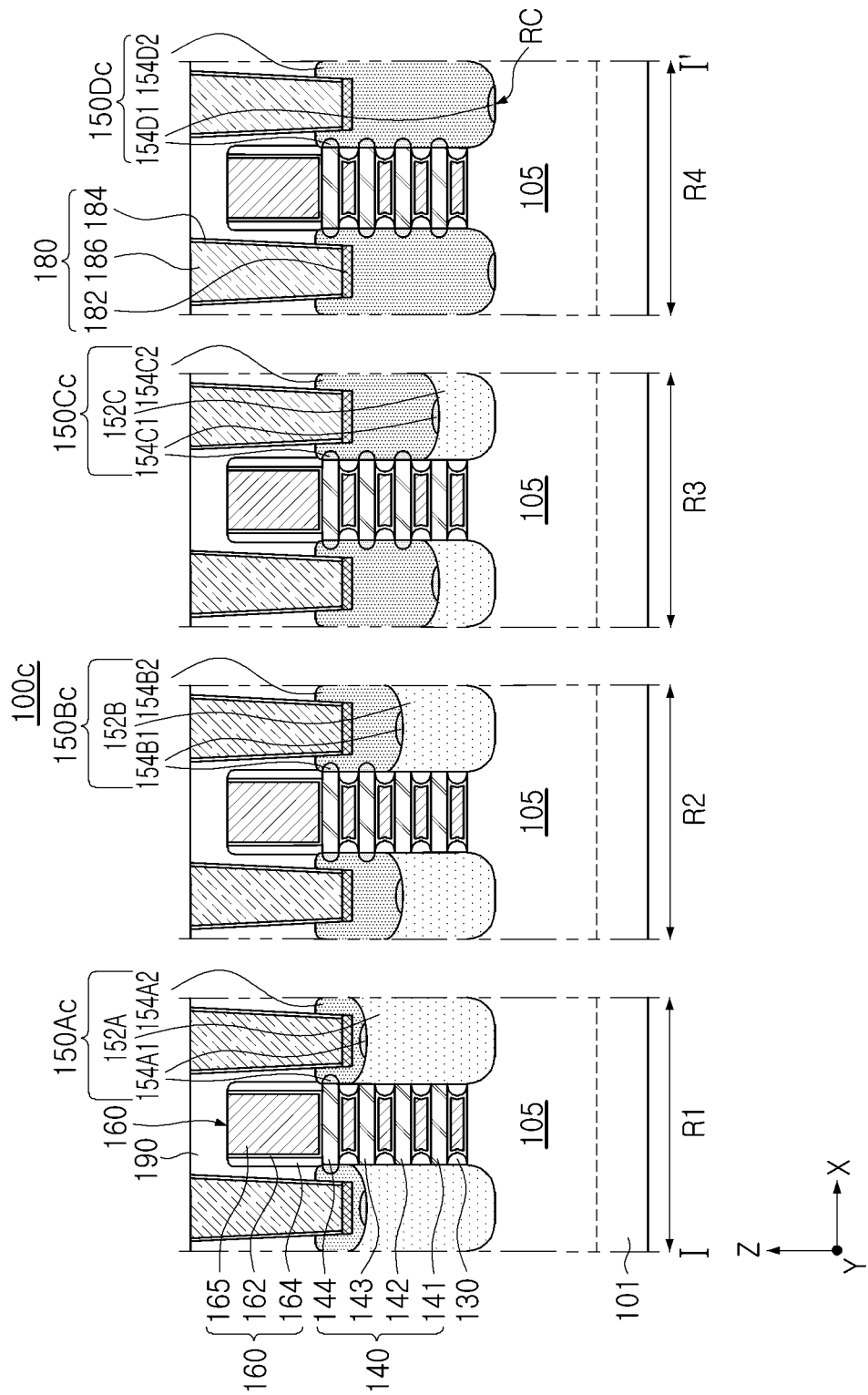
FIGS. 6A and 6B are cross-sectional views illustrating semiconductor devices according to example embodiments.
Figure 6B:
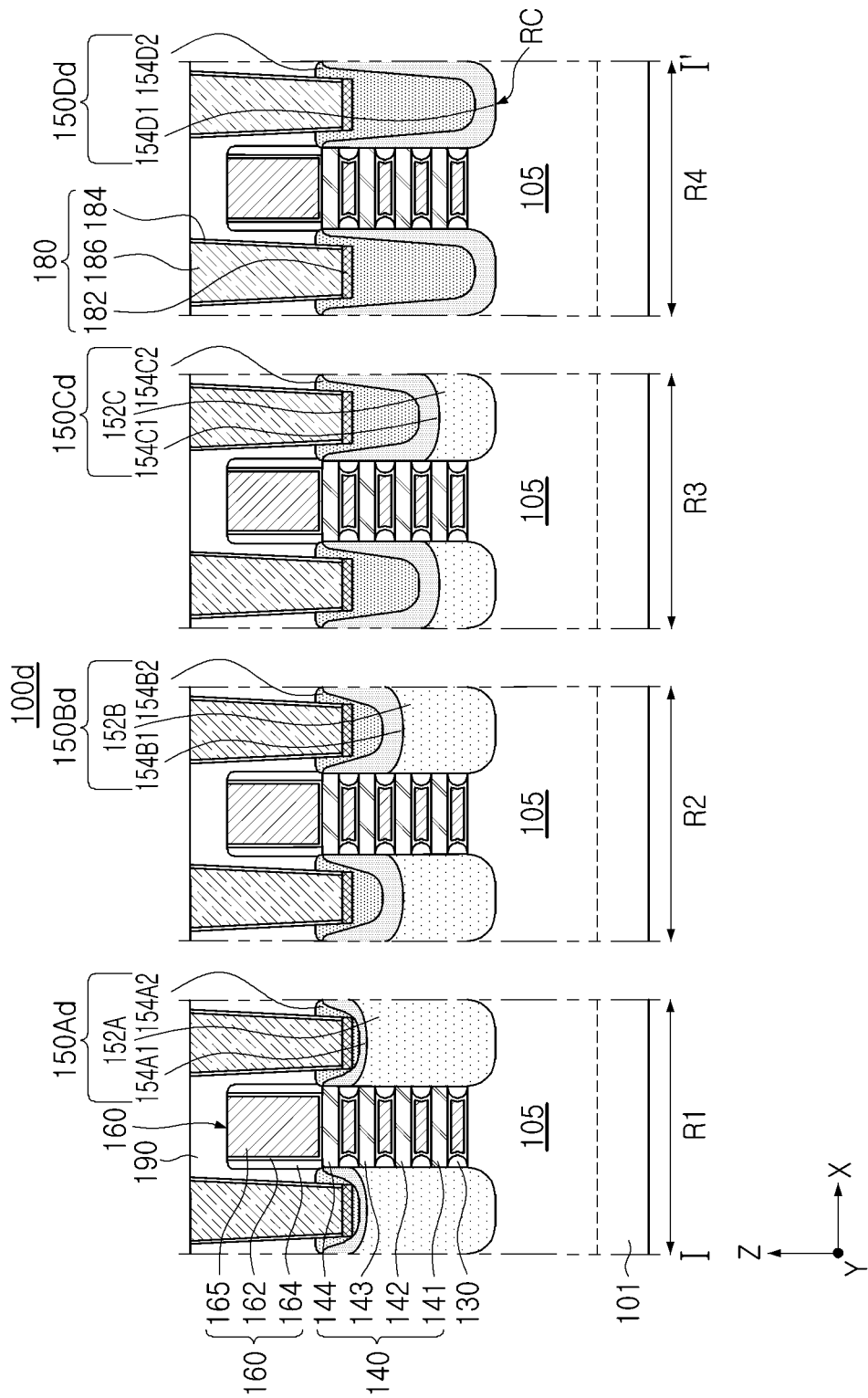

FIGS. 6A and 6B are cross-sectional views illustrating semiconductor devices according to example embodiments. FIGS. 6A and 6B respectively illustrate cross-sections corresponding to FIG. 2A.

Referring to FIG. 6A, in a semiconductor device 100c, source/drain regions 150Ac, 150Bc, 150Cc, and 150Dc may include first layers 154A1, 154B1, 154C1, and 154D1 and second layers 154A2, 154B2, 154C2, and 154D2 forming second epitaxial layers.

The first layers 154A1, 154B1, 154C1, and 154D1 may be disposed on side surfaces of the channel layers 141, 142, 143, and 144 connected to the second epitaxial layers and may be disposed on bottom surfaces of recess regions RC. The second layers 154A2, 154B2, 154C2, and 154D2 may be disposed to at least partially fill regions excluding the first epitaxial layers 152A, 152B, and 152C and the first layers 154A1, 154B1, 154C1 and 154D1 in the recess regions RC. The first layers 154A1, 154B1, 154C1, and 154D1 may be spaced apart from each other on both inner side walls of the source/drain regions 150Ac, 150Bc, 150Cc, and 150Dc, thus suppressing a short channel effect due to diffusion of impurities in the second layers 154A2, 154B2, 154C2, and 154D2.

The first layers 154A1, 154B1, 154C1, and 154D1 and the second layers 154A2, 154B2, 154C2, and 154D2 may include impurities of different elements and/or concentrations. The impurities may be, for example, phosphorus (P), arsenic (As), antimony (Sb), boron (B), gallium (Ga), and/or aluminum (Al). For example, the second layers 154A2, 154B2, 154C2, and 154D2 may have higher concentrations of impurity elements than the first layers 154A1, 154B1, 154C1, and 154D1.

Referring to FIG. 6B, in source/drain regions 150Ad, 150Bd, 150Cd, and 150Dd of a semiconductor device 100d, first layers 154A1, 154B1, 154C1, and 154D1 may be different in arrangement from the embodiment of FIG. 6A.

The first layers 154A1, 154B1, 154C1, and 154D1 may be disposed on the active region 105 and be on and at least partially cover side surfaces of the channel structures 140 and the internal spacer layers 130. Accordingly, the second layers 154A2, 154B2, 154C2, and 154D2 may be disposed to be spaced apart from the active region 105 by the first layers 154A1, 154B1, 154C1, and 154D1. The contact plugs 180 may be disposed to be connected to the second layers 154A2, 154B2, 154C2, and 154D2.

In example embodiments, the embodiments of FIGS. 6A and 6B may also be applied to the embodiment of FIG. 5.

Figure 7A:
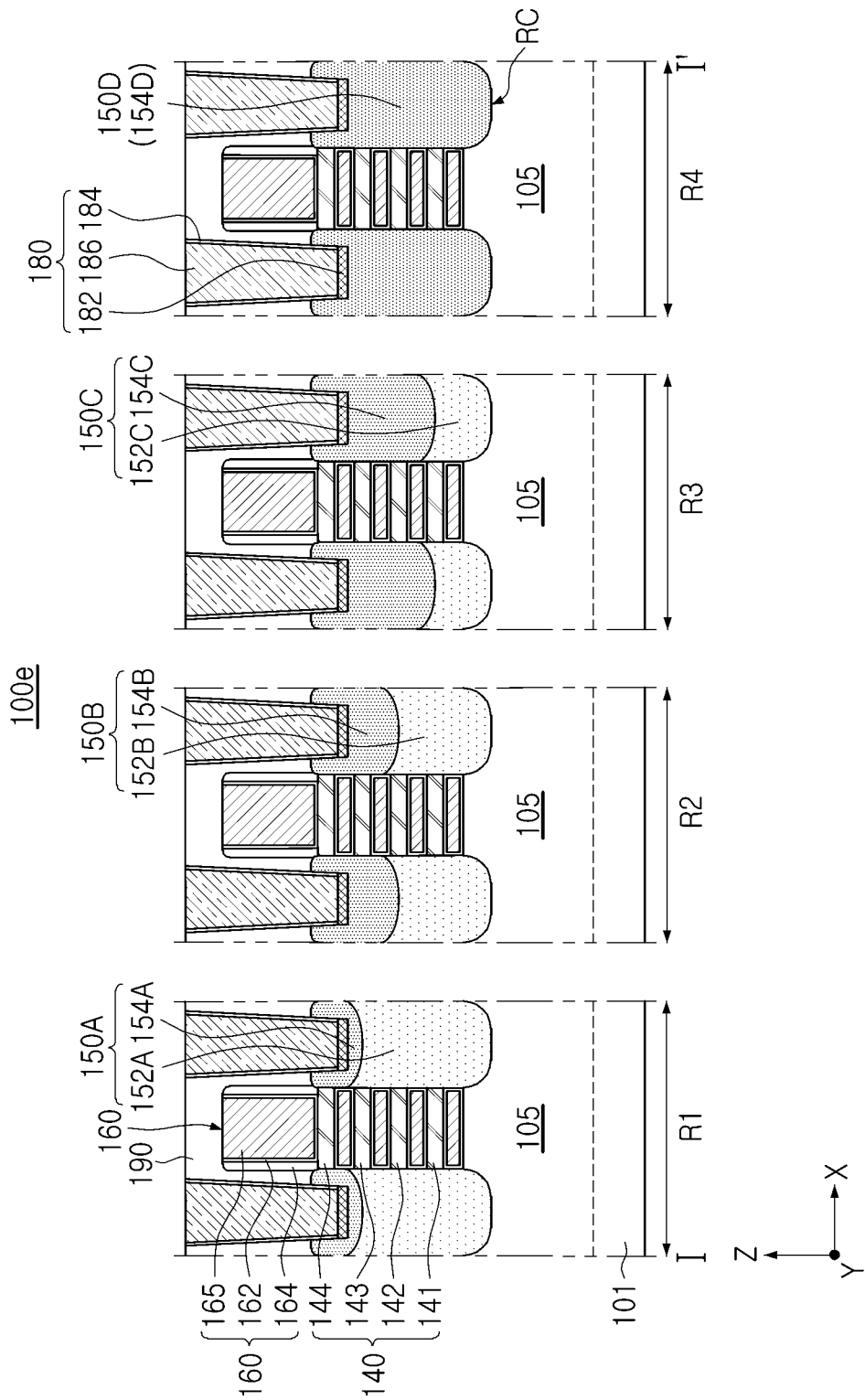
FIGS. 7A and 7B are cross-sectional views illustrating semiconductor devices according to example embodiments.
Figure 7B:
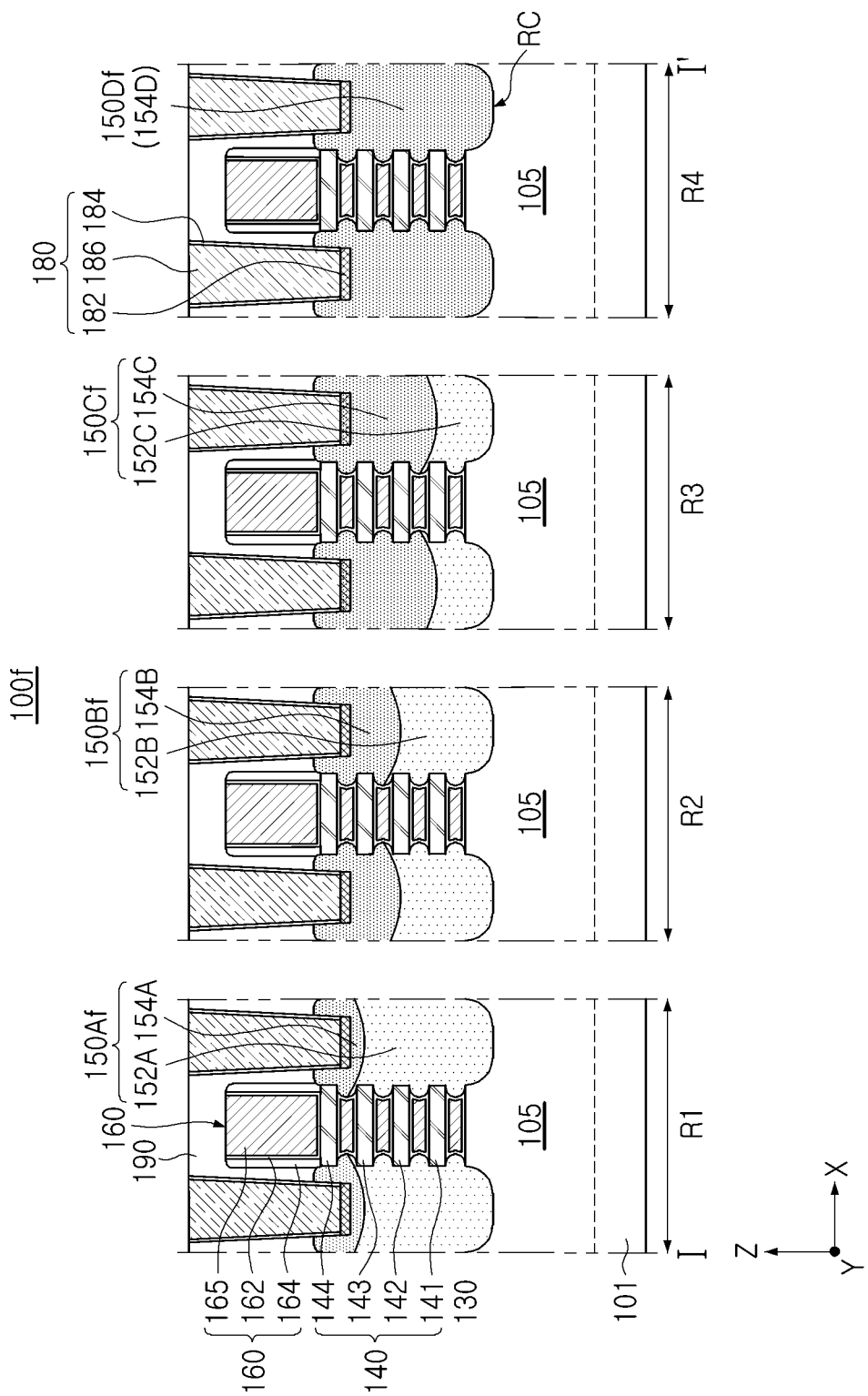

FIGS. 7A and 7B are cross-sectional views illustrating a semiconductor device according to example embodiments. FIGS. 7A and 7B respectively illustrate a cross-section corresponding to FIG. 2A.

Referring to FIG. 7A, a semiconductor device 100e may not include the inner spacer layer 130, unlike the example embodiment of FIGS. 1 to 2B. In this case, the gate electrodes 165 positioned between the first to fourth channel layers 141, 142, 143, and 144 and below the first channel layer 141 may be arranged to extend in the X direction. Also, the gate electrodes 165 may be spaced apart from the source/drain regions 150A, 150B, 150C, and 150D by the gate dielectric layers 162.

According to this structure, because the inner spacer layer 130 is omitted, the source/drain regions 150A, 150B, 150C, and 150D may have improved crystallinity when the source/drain regions 150A, 150B, 150C, and 150D are grown. In some embodiments, the inner spacer layer 130 may be omitted only in some devices of the semiconductor device 100e. For example, when SiGe is used in the source/drain regions 150A, 150B, 150C, and 150D in the pFET, the inner spacer layer 130 may be selectively omitted only in the pFET to improve crystallinity of SiGe.

Referring to FIG. 7B, in a semiconductor device 100f, a shape of source/drain regions 150Af, 150Bf, 150Cf, and 150Df may be different from that of the embodiment of FIG. 7A. The source/drain regions 150Af, 150Bf, 150Cf, and 150Df may have a shape extending to regions in which the internal spacer layers 130 are omitted. Accordingly, the source/drain regions 150Af, 150Bf, 150Cf, and 150Df may include regions extended between the first to fourth channel layers 141, 142, 143, and 144 in regions in physical contact with the gate dielectric layers 162.

In example embodiments, the embodiments of FIGS. 7A and 7B may be applied to the embodiment of FIG. 5, and the embodiments of FIGS. 6A and 6B may be combined to the embodiments of FIGS. 7A and 7B.

Figure 8:
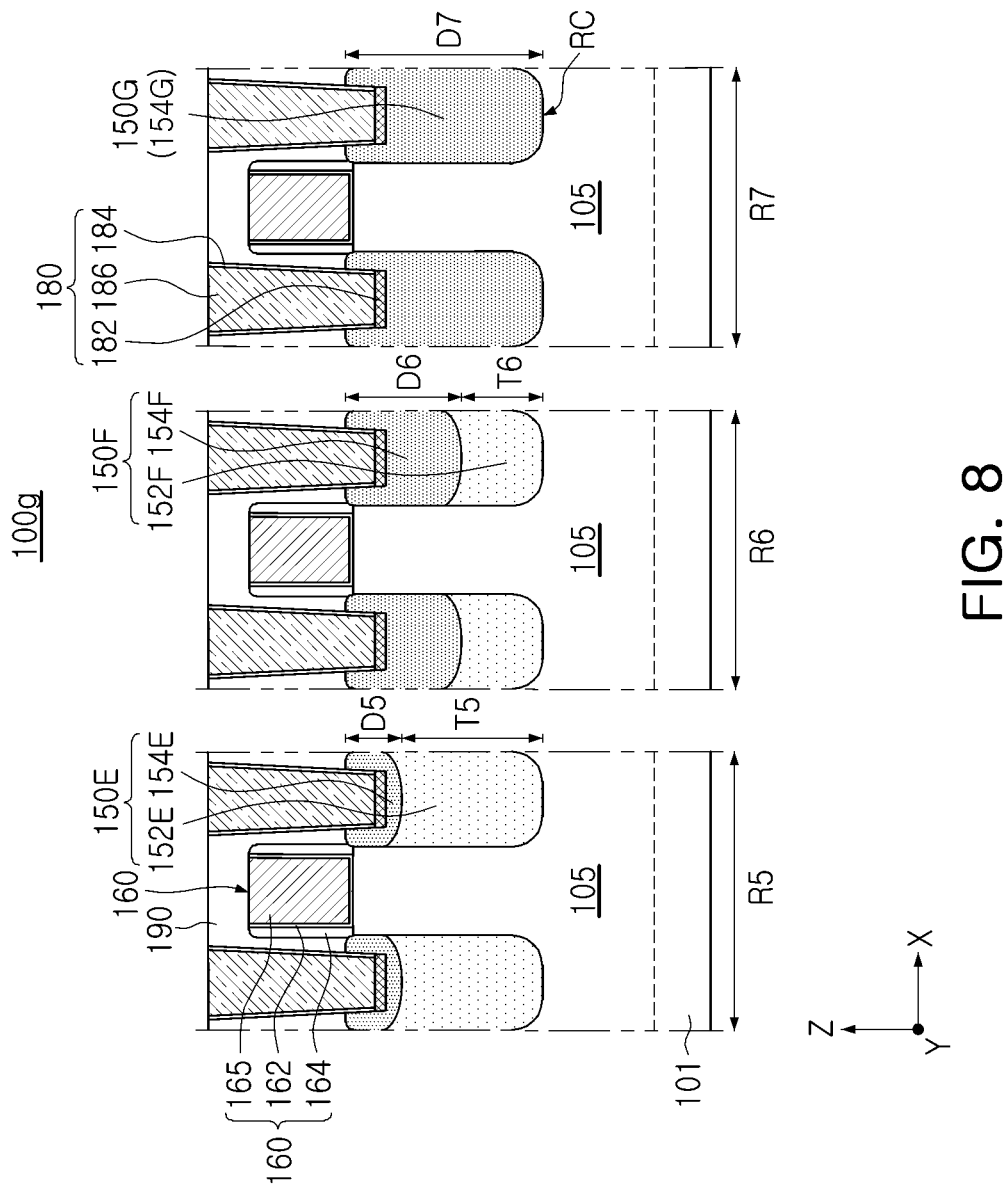
FIG. 8 is a cross-sectional view illustrating a semiconductor device according to example embodiments.

FIG. 8 is a cross-sectional view illustrating a semiconductor device according to example embodiments.

Referring to FIG. 8, a semiconductor device 100g may not include the channel structures 140, unlike the example embodiment of FIGS. 1 to 2B. In the semiconductor device 100g, channel regions of transistors may be formed in active regions 105 having a fin structure. Such a semiconductor device 100g may be additionally disposed in a region of a semiconductor device of other embodiments.

In the semiconductor device 100g, the substrate 101 may have fifth to seventh regions R5, R6, and R7. The semiconductor device 100g may include fifth to seventh source/drain regions 150E, 150F, and 150G respectively disposed in the fifth to seventh regions R5, R6, and R7.

In the source/drain regions 150E, 150F, and 150G, the recess regions RC may have substantially the same depth and size. In the source/drain regions 150E, 150F, and 150G, relative thicknesses and depths of the first epitaxial layers 152E and 152F and the second epitaxial layers 154E, 154F, and 154G may be different from each other. Accordingly, the source/drain regions 150E, 150F, and 150G may have different thickness ratios of the first epitaxial layers 152E and 152F to the second epitaxial layers 154E, 154F, and 154G, respectively.

In the fifth source/drain region 150E, the first epitaxial layer 152E may have a fifth thickness T5, and in the sixth source/drain region 150F, the first epitaxial layer 152F may have a sixth thickness T6 smaller than the fifth thickness T5, and the seventh source/drain region 150G may not include the first epitaxial layer. Also, in the fifth source/drain region 150E, the second epitaxial layer 154E may have a fifth depth D5 from an upper surface of the fifth source/drain region 150E, in the sixth source/drain region 150F, the second epitaxial layer 154F may have a sixth depth D6 greater than the fifth depth D5, and in the seventh epitaxial layer 154G, the second epitaxial layer 154G may have a seventh depth D7 greater than the sixth depth D6. In addition, for materials of the first epitaxial layers 152E and 152F and the second epitaxial layers 154E, 154F, and 154G, the above description with reference to FIGS. 1 to 2B may be equally applied.

The semiconductor device 100g includes devices each including the fifth to seventh source/drain regions 150E, 150F, and 150G having different depths, so that a driving current may be differentiated without changing an area of the devices. In example embodiments, the semiconductor device 100g may further include a device including a source/drain region in which the depth of the second epitaxial layer is different from that of the fifth to seventh source/drain regions 150E, 150F, and 150G.

In example embodiments, other embodiments including the embodiments of FIGS. 5 to 6B may be combined with present embodiment.

Figure 9A:
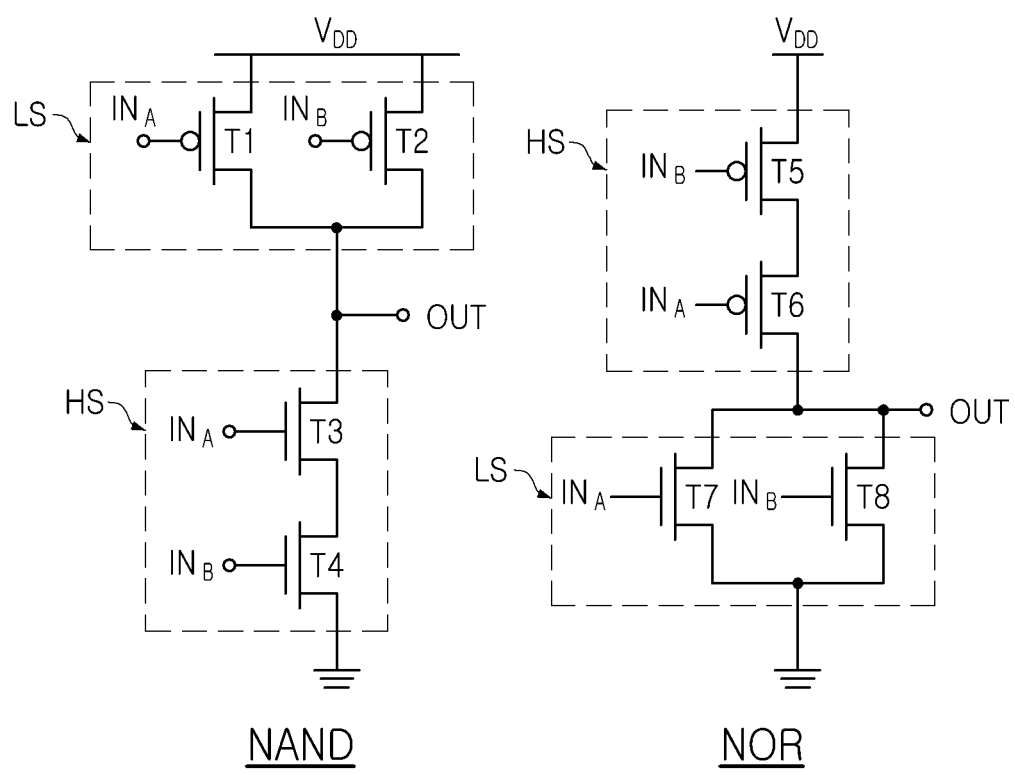
FIGS. 9A and 9B are circuit diagrams and cross-sectional views of semiconductor devices according to example embodiments.
Figure 9B:
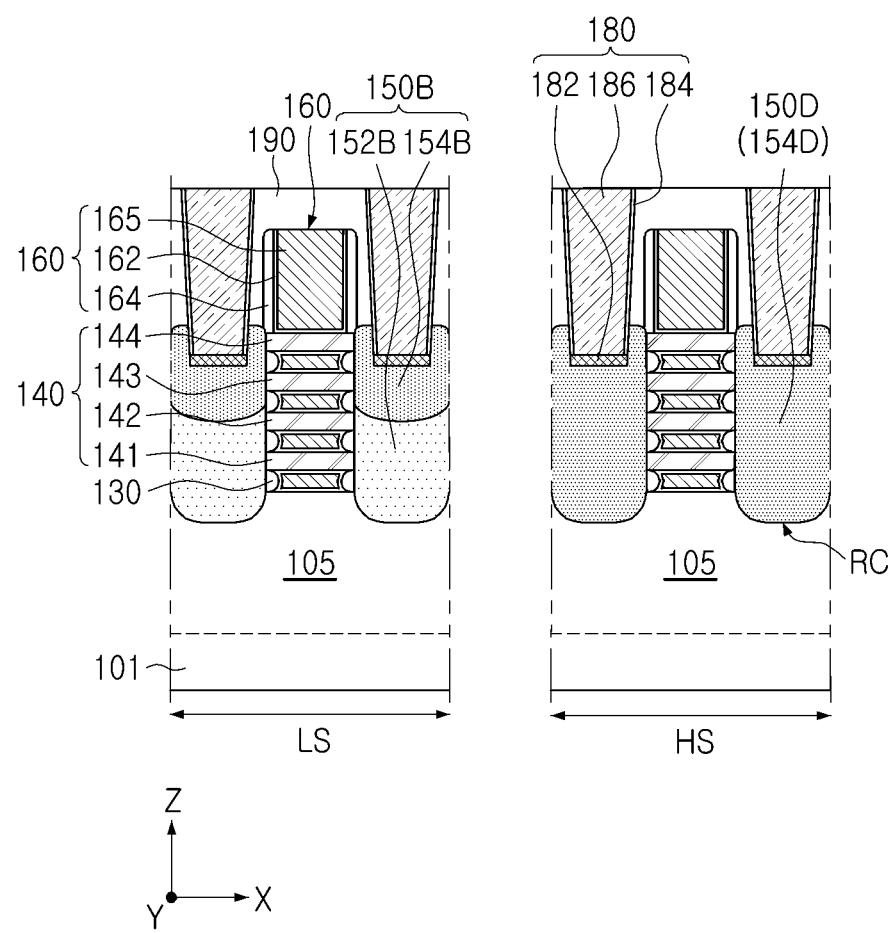

FIGS. 9A and 9B are circuit diagrams and cross-sectional views of semiconductor devices according to example embodiments.

Referring to FIG. 9A, a NAND circuit and a NOR circuit are shown separately. The NAND circuit includes two transistors T1 and T2 connected in parallel and connected to a first power source $V_{DD}$ and two transistors T3 and T4 connected in series with each other and connected to a second power source or grounded. The NOR circuit includes two transistors T5 and T6 connected in series and connected to a first power source $V_{DD}$ and two transistors T7 and T8 connected in parallel and connected to a second power source or grounded.

In the NAND circuit and the NOR circuit, two devices connected in parallel may form a low-speed region LS, and two devices connected in series may form a high-speed region HS. The low speed region LS may be a region in which a required device speed is relatively low, and the high speed region HS may be a region in which a required device speed is relatively high.

Referring to FIG. 9B, in the low-speed region LS, a device in which the number of channel layers 143 and 144 connected to the second epitaxial layer 154B of the source/drain region 150B, among the channel layers 141, 142, 143, and 144, is relatively small may be disposed. Accordingly, power consumption may be reduced. In the high-speed region HS, a device in which the number of channel layers 141, 142, 143, and 144 connected to the second epitaxial layer 154D of the source/drain region 150D, among the channel layers 141, 142, 143, and 144, is relatively large may be disposed. Accordingly, the speed and the amount of current of the device may be secured. In some embodiments, the device of the first region R1 of FIG. 2A may be disposed in the low-speed region LS, and the device of the third region R3 of FIG. 2A may be disposed in the high-speed region HS.

As such, in example embodiments, the shape of the source/drain regions may be variously selected according to the type and characteristics of a circuit formed by the device. Accordingly, power efficiency of the entire semiconductor device may be improved or optimized.

Figure 10A:
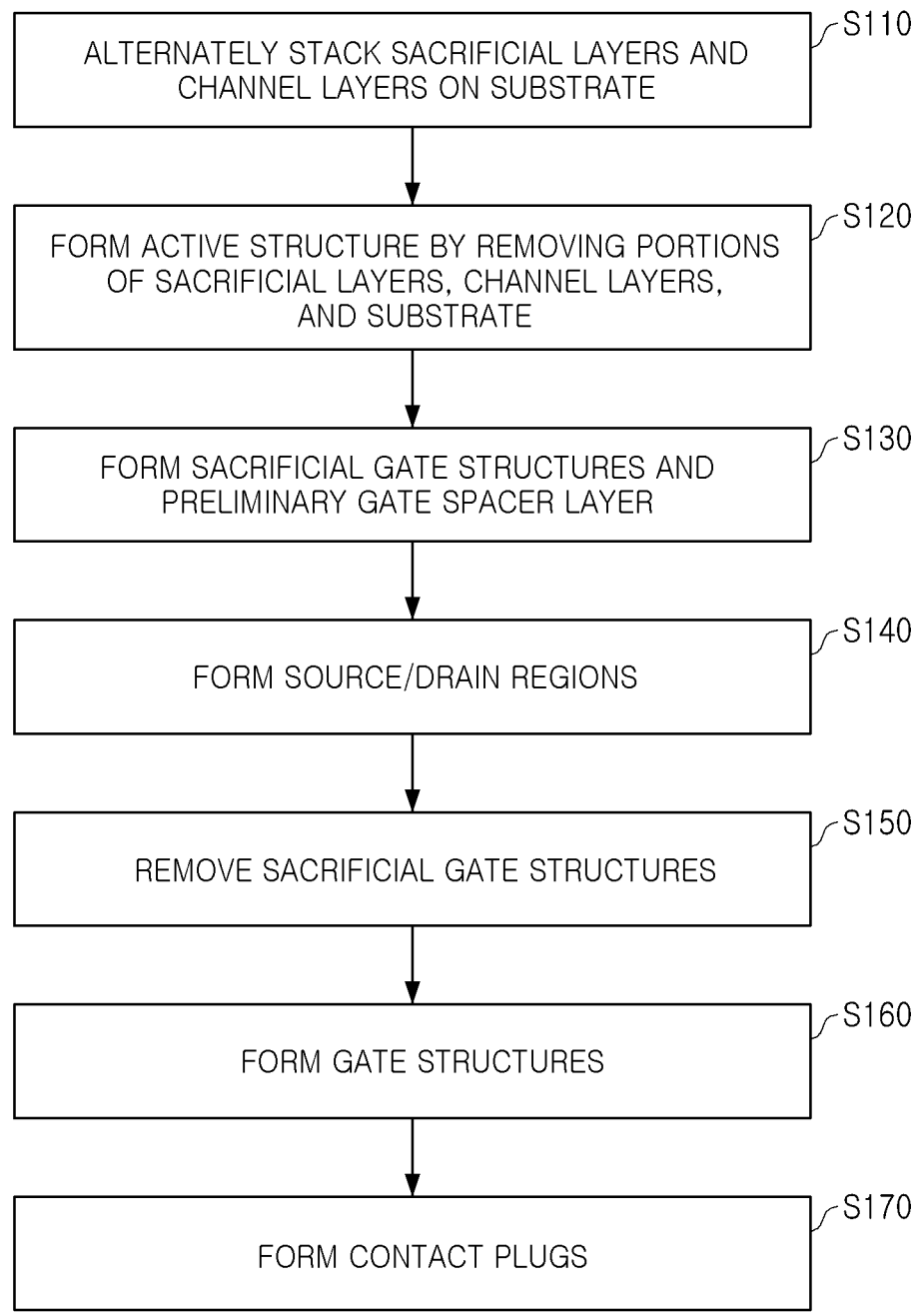
FIGS. 10A and 10B are flowcharts illustrating a method of manufacturing a semiconductor device according to example embodiments.
Figure 10B:
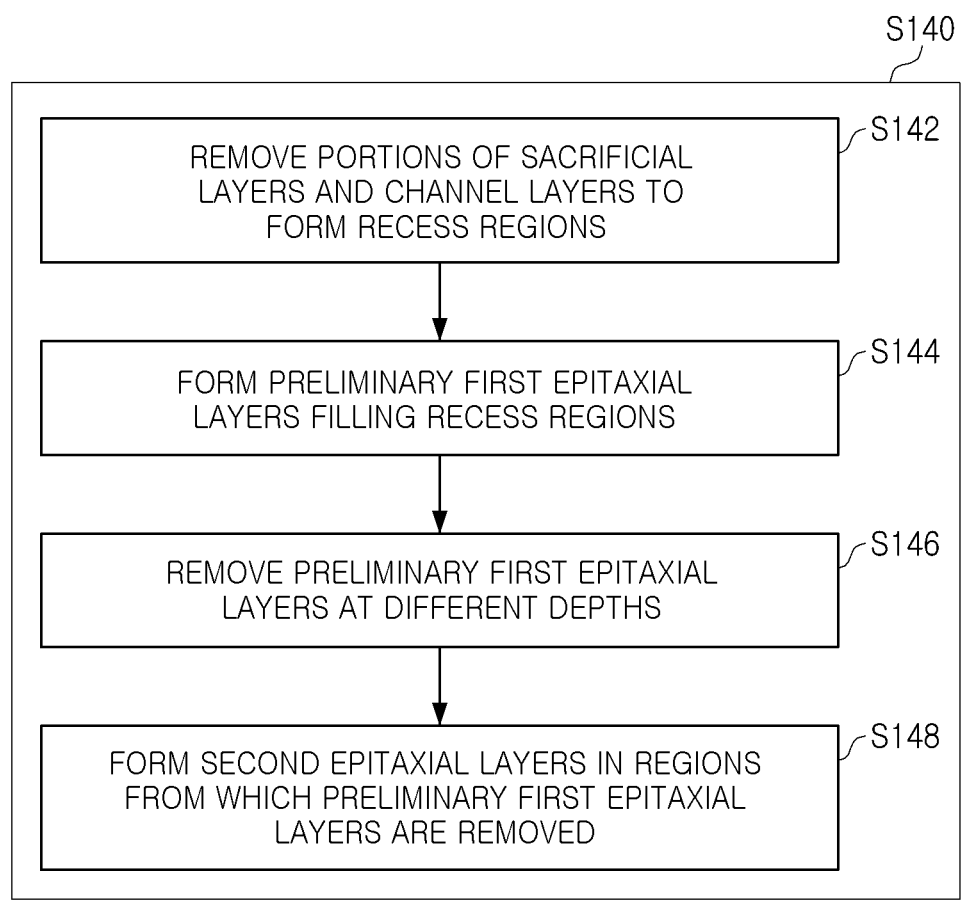

FIGS. 10A and 10B are flowcharts illustrating a method of manufacturing a semiconductor device according to example embodiments.

FIGS. 11A to 11K are diagrams illustrating a process sequence of a method of manufacturing a semiconductor device according to example embodiments. FIGS. 11A to 11K illustrate an embodiment of a manufacturing method for manufacturing the semiconductor device of FIGS. 1 to 2B and illustrate cross-sections corresponding to FIGS. 2A and 2B.

Figure 11A:
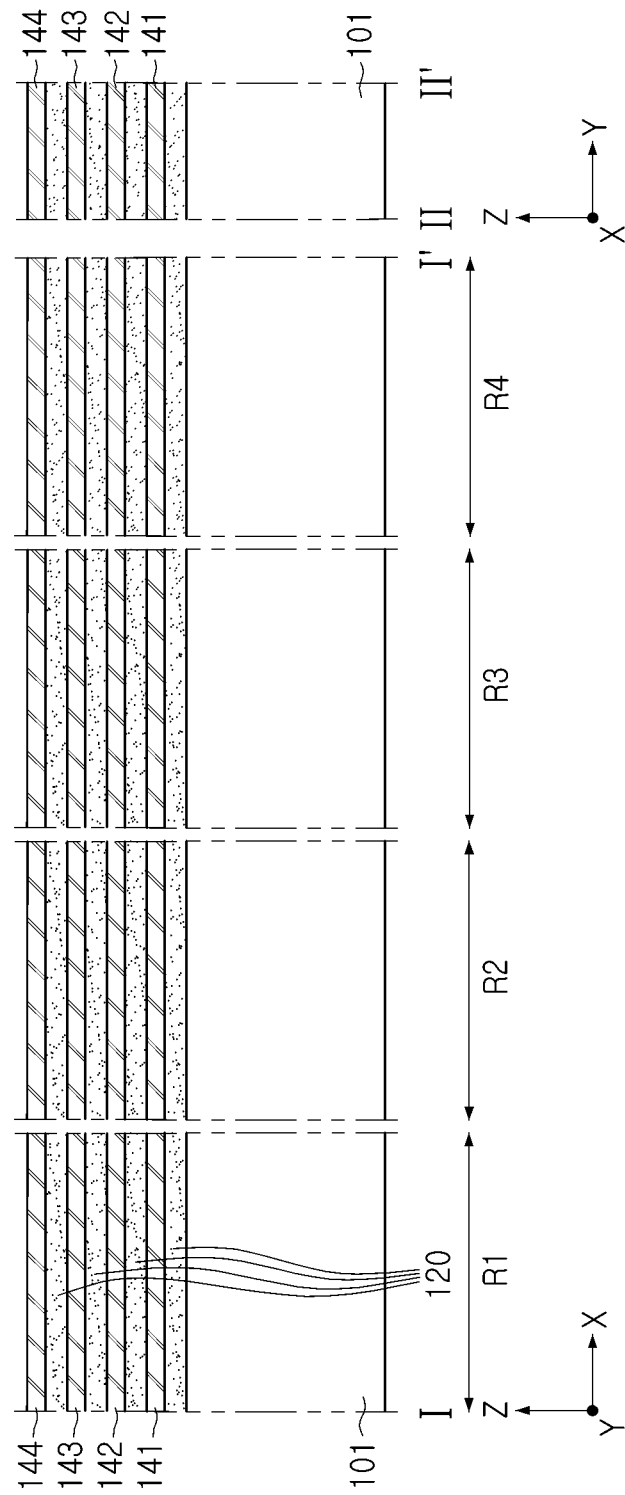
FIGS. 11A to 11K are views illustrating a process sequence of a method of manufacturing a semiconductor device according to example embodiments.

Referring to FIGS. 10A and 11A, sacrificial layers 120 and the channel layers 141, 142, 143, and 144 may be alternately stacked on a substrate 101 (S110).

The sacrificial layers 120 may be replaced by the gate dielectric layer 162 and the gate electrode 165 as shown in FIGS. 2A and 2B through a follow-up process. The sacrificial layers 120 may be formed of a material having etch selectivity with respect to each of the channel layers 141, 142, 143, and 144. The channel layers 141, 142, 143, and 144 may include a material different from that of the sacrificial layers 120. The sacrificial layers 120 and the channel layers 141, 142, 143, and 144 may include, for example, a semiconductor material including at least one of silicon (Si), silicon germanium (SiGe), and/or germanium (Ge), may include different materials, and may or may not include impurities. For example, the sacrificial layers 120 may include silicon germanium (SiGe), and the channel layers 141, 142, 143, and 144 may include silicon (Si).

The sacrificial layers 120 and the channel layers 141, 142, 143, and 144 may be formed by performing an epitaxial growth process from the substrate 101. Each of the sacrificial layers 120 and the channel layers 141, 142, 143, and 144 may have a thickness in a range of about 1 Å to about 100 nm. The number of layers of the channel layers 141, 142, 143, and 144 alternately stacked with the sacrificial layers 120 may be variously changed in accordance with different embodiments.

Figure 11B:
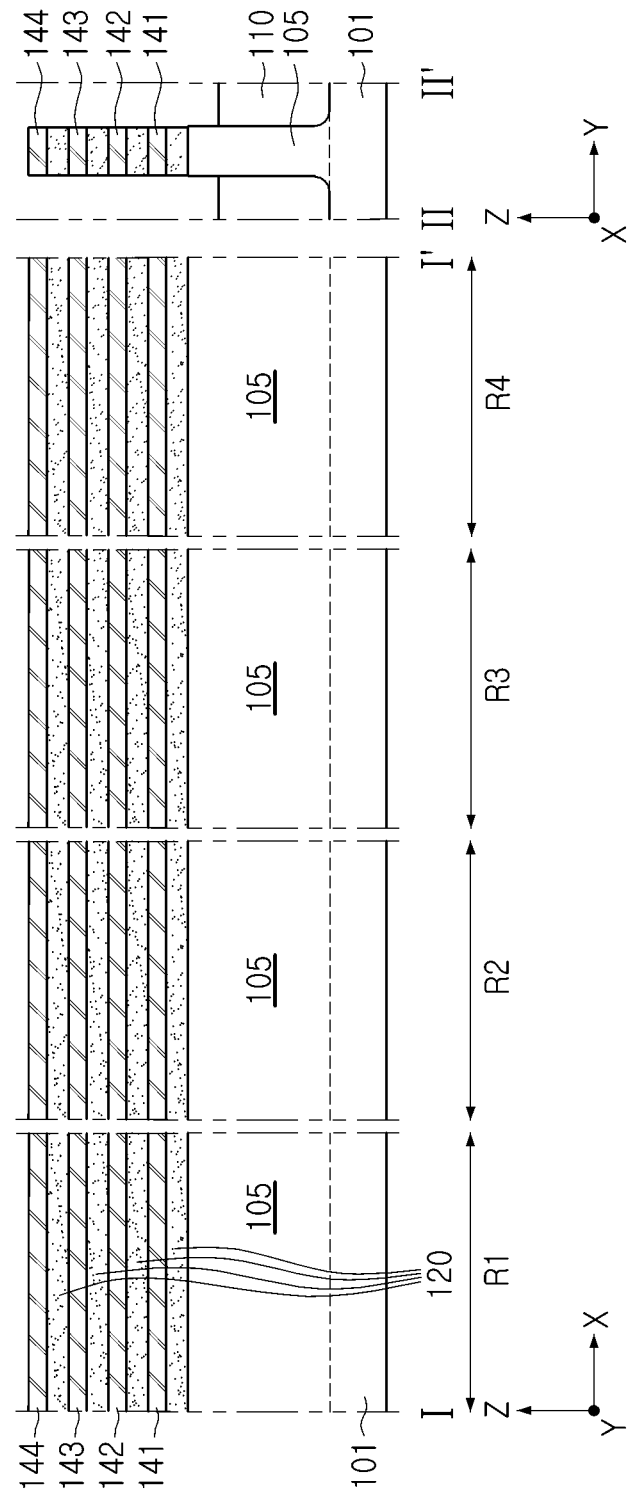

Referring to FIGS. 10A and 11B, active structures are formed by removing a portion of the sacrificial layers 120, the channel layers 141, 142, 143, and 144, and the substrate 101, and device isolation layer 110 may be formed (S120).

The active structures may include the sacrificial layers 120 and channel layers 141, 142, 143, and 144 alternately stacked with each other, and may further include active regions 105 formed to protrude from the substrate 101 by removing a portion of the substrate 101. The active structures may be formed in a line shape extending in one direction, e.g., the X direction, and may be formed to be spaced apart from each other in the Y direction.

In a region from which a portion of the substrate 101 is removed, an insulating material may be filled, and thereafter, the insulating material may be partially removed such that the active regions 105 protrude, thereby forming the device isolation layer 110. An upper surface of the device isolation layer 110 may be formed to be lower than an upper surface of the active regions 105.

Figure 11C:
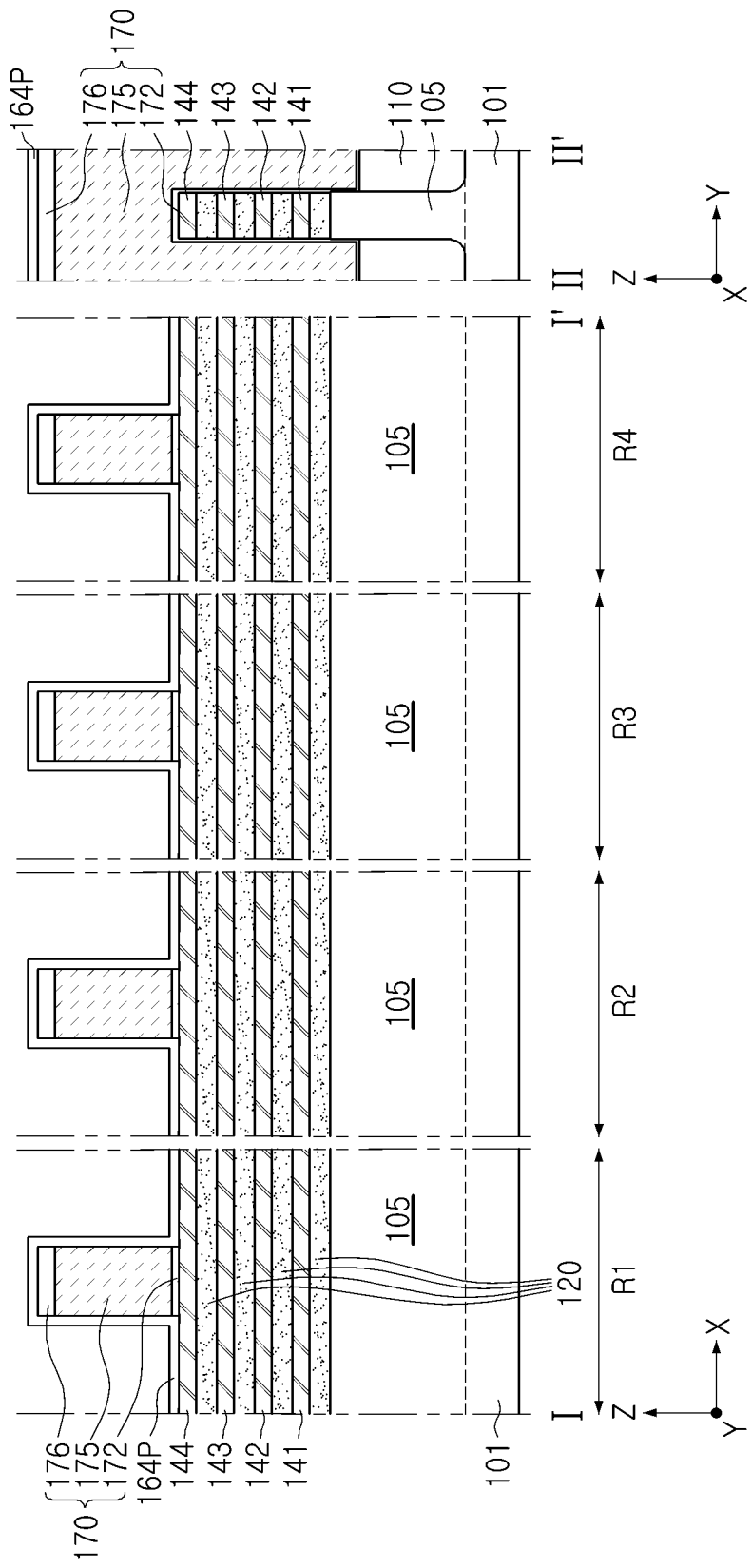

Referring to FIGS. 10A and 11C, sacrificial gate structures 170 and a preliminary gate spacer layer 164P may be formed on the active structure (S130).

The sacrificial gate structures 170 may be formed in a region where the gate dielectric layer 162 and the gate electrode 165 are disposed on the channel structures 140 as shown in FIGS. 2A and 2B through a follow-up process. The sacrificial gate structure 170 may include first and second sacrificial gate layers 172 and 175 and a mask pattern layer 176 that are sequentially stacked. The first and second sacrificial gate layers 172 and 175 may be patterned using a mask pattern layer 176. The first and second sacrificial gate layers 172 and 175 may be an insulating layer and a conductive layer, respectively, but embodiments are not limited thereto, and the first and second sacrificial gate layers 172 and 175 may be formed as a single layer. For example, the first sacrificial gate layer 172 may include silicon oxide, and the second sacrificial gate layer 175 may include polysilicon. The mask pattern layer 176 may include silicon oxide and/or silicon nitride. The sacrificial gate structures 170 may have a line shape that crosses the active structures and extends in one direction. The sacrificial gate structures 170 may extend, for example, in the Y direction and may be disposed to be spaced apart from each other in the X direction.

The preliminary gate spacer layer 164P may be formed on both side walls of the sacrificial gate structures 170. The preliminary gate spacer layer 164P may be formed as a film having a uniform thickness on upper and side surfaces of the sacrificial gate structures 170 and the active structures. The preliminary gate spacer layer 164P may be formed of a low-k material, and may include, for example, at least one of SiO, SiN, SiCN, SiOC, SiON, and/or SiOCN.

The operation S140 of forming the source/drain regions 150A, 150B, 150C, and 150D will be described with reference to FIGS. 10A, 10B, and 11D to 11G.

Figure 11D:
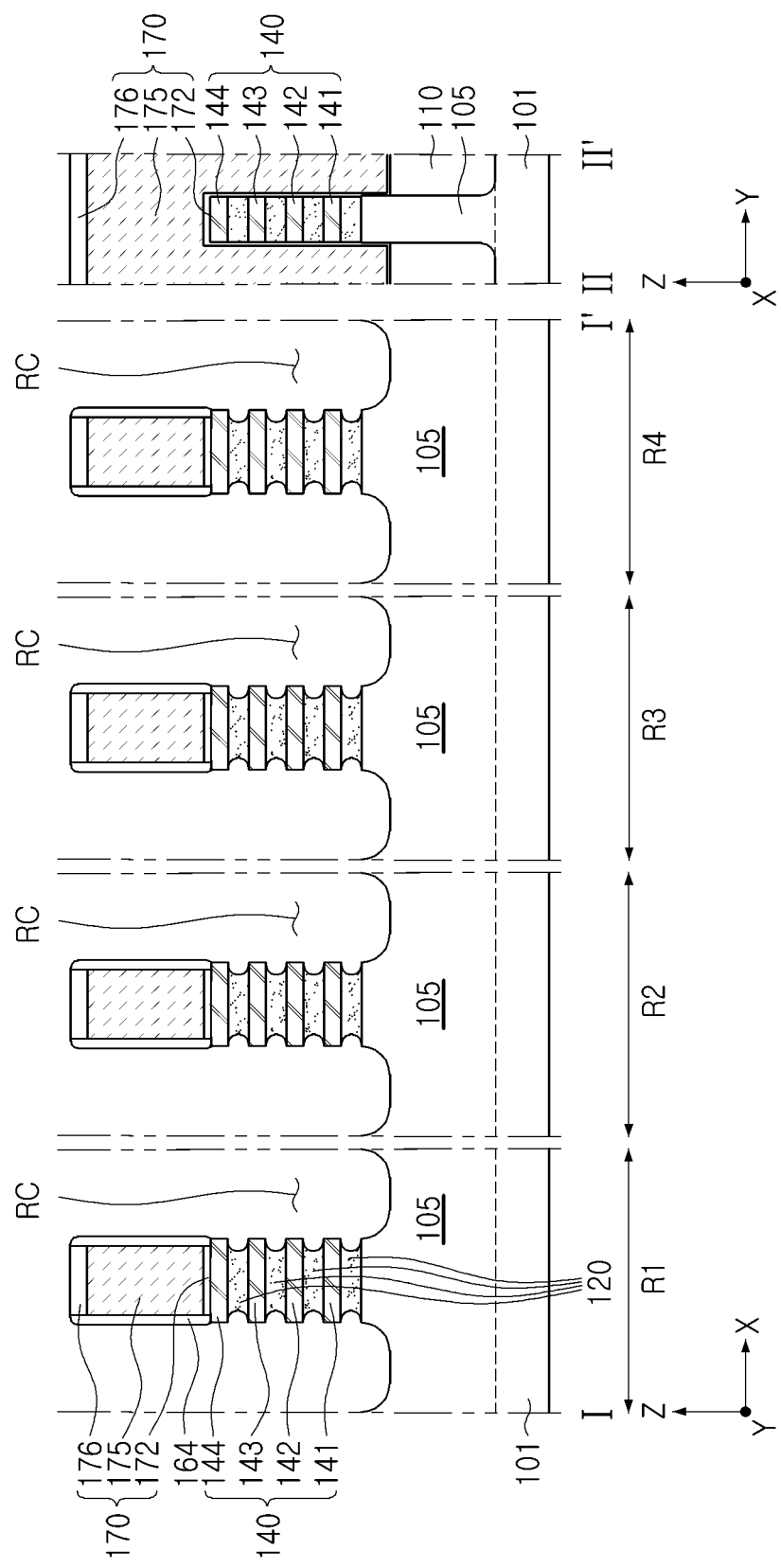

First, referring to FIGS. 10B and 11D, portions of the sacrificial layers 120 and the channel layers 142, 142, 143, and 144 are removed between the sacrificial gate structures 170 to form the recess regions RC (S142), and portions of the exposed sacrificial layers 120 may be removed from the side thereof.

First, the recess regions RC may be formed by removing the exposed sacrificial layers 120 and the channel layers 141, 142, 143, and 144 using the sacrificial gate structures 170 and the preliminary gate spacer layer 164P as masks. Accordingly, the channel layers 141, 142, 143, and 144 may form the channel structure 140 having a limited length in the X direction, and the preliminary gate spacer layer 164P may be partially removed to form the gate spacer layers 164. The recess regions RC may be formed to have a constant size and depth in the first to fourth regions R1, R2, R3, and R4.

Next, the sacrificial layers 120 may be selectively etched with respect to the channel structures 140 by, for example, a wet etching process, and removed to a predetermined depth from the side surface in the X direction. The sacrificial layers 120 may have inwardly concave side surfaces by lateral etching as described above. However, the shape of the side surfaces of the sacrificial layers 120 is not limited to any particular shape in accordance with various embodiments.

As shown in FIG. 11D, both side surfaces of the sacrificial layers 120 and the channel structure 140 in the X direction may be located under the sacrificial gate structures 170 and the gate spacer layers 164. However, the degree to which the sacrificial layers 120 and the channel structure 140 are removed from the side surfaces may be variously changed according to embodiments.

Figure 11E:
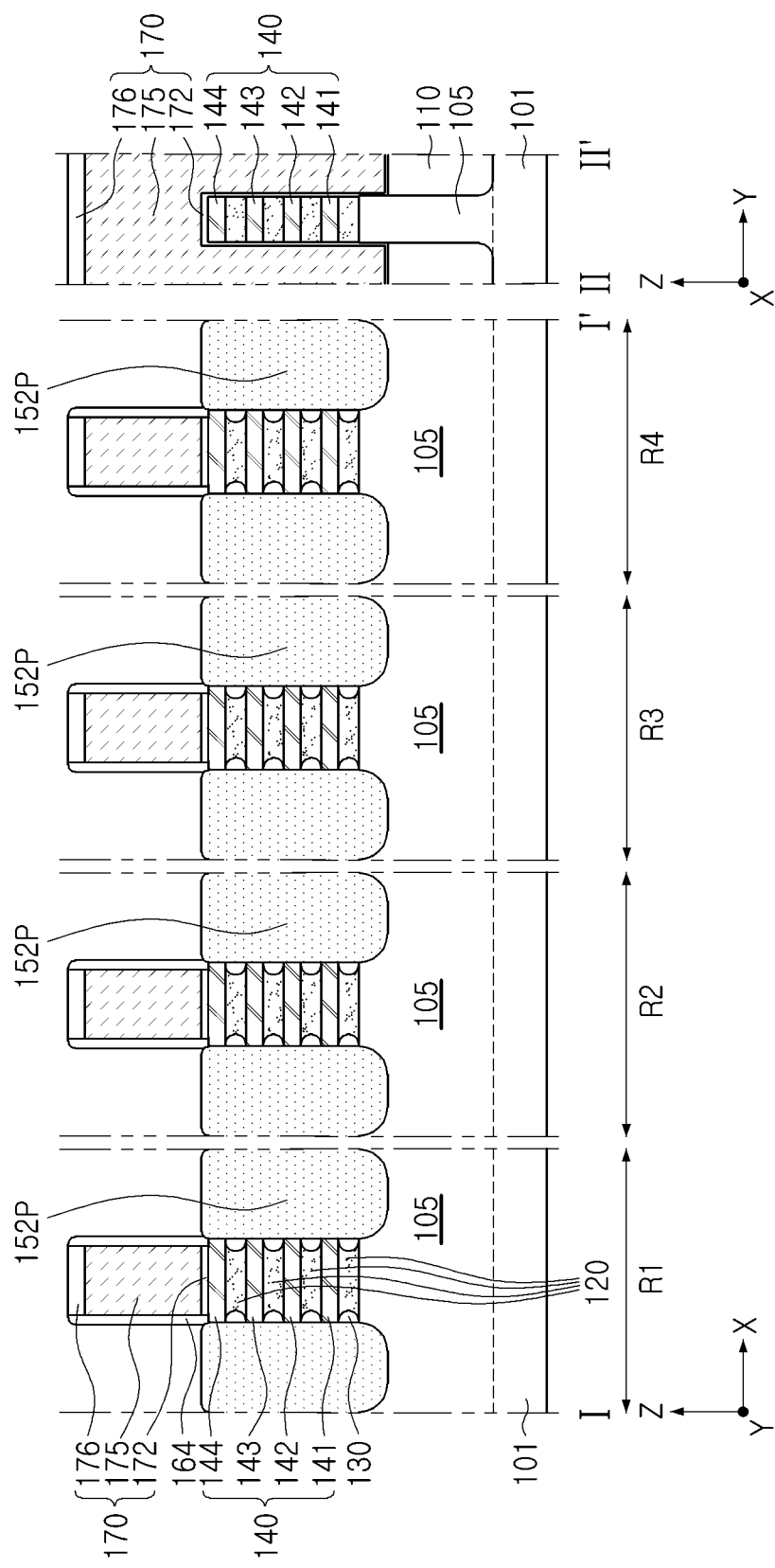

Referring to FIGS. 10B and 11E, after the internal spacer layers 130 are formed, preliminary first epitaxial layers 152P at least partially filling the recess regions RC may be formed (S144).

First, the internal spacer layers 130 may be formed in the region from which the sacrificial layers 120 are removed. The internal spacer layers 130 may be formed by at least partially filling the region from which the sacrificial layers 120 are removed with an insulating material and then removing the insulating material deposited on the outside of the channel structures 140. The internal spacer layers 130 may be formed of the same material as the spacer layers 164, but embodiments are not limited thereto. For example, the internal spacer layers 130 may include at least one of SiN, SiCN, SiOCN, SiBCN, and/or SiBN.

Next, the preliminary first epitaxial layers 152P may be formed to fully fill the recess regions RC in the first to fourth regions R1, R2, R3, and R4. The preliminary first epitaxial layers 152P may be formed by growing from the active region 105 by, for example, a selective epitaxial process. In the case of embodiment of FIG. 2A, the preliminary first epitaxial layers 152P may be formed to include in-situ doped impurities. In the case of embodiment of FIG. 5, the preliminary first epitaxial layers 152P may be formed of an insulating layer, for example, a single crystal insulating layer.

Figure 11F:
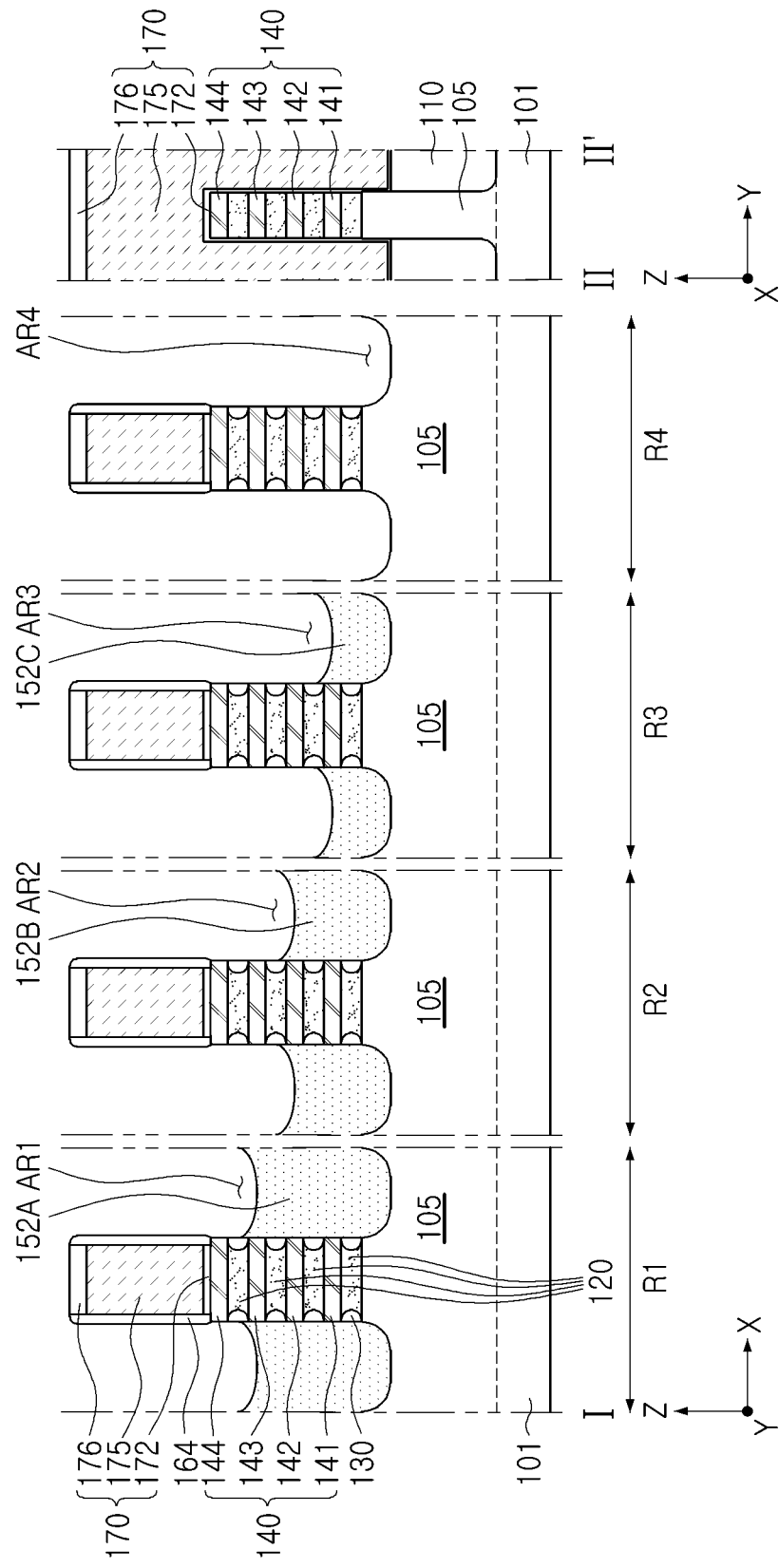

Referring to FIGS. 10B and 11F, the preliminary first epitaxial layers 152P may be removed to different depths (S146).

The preliminary first epitaxial layers 152P may be removed to have different depths in the first to fourth regions R1, R2, R3, and R4 to form first to fourth additional recess regions AR1, AR2, AR3, and AR4, respectively. To this end, a photolithography process and an etching process for sequentially exposing the first to fourth regions R1, R2, R3, and R4 may be performed a plurality of times.

In the first region R1, the relatively smallest amount of the preliminary first epitaxial layer 152P may be removed, and in the fourth region R4, all of the preliminary first epitaxial layer 152P may be removed. Through this operation, first epitaxial layers 152A, 152B, and 152C having different thicknesses may be formed in the first to third regions R1, R2, and R3.

Figure 11G:
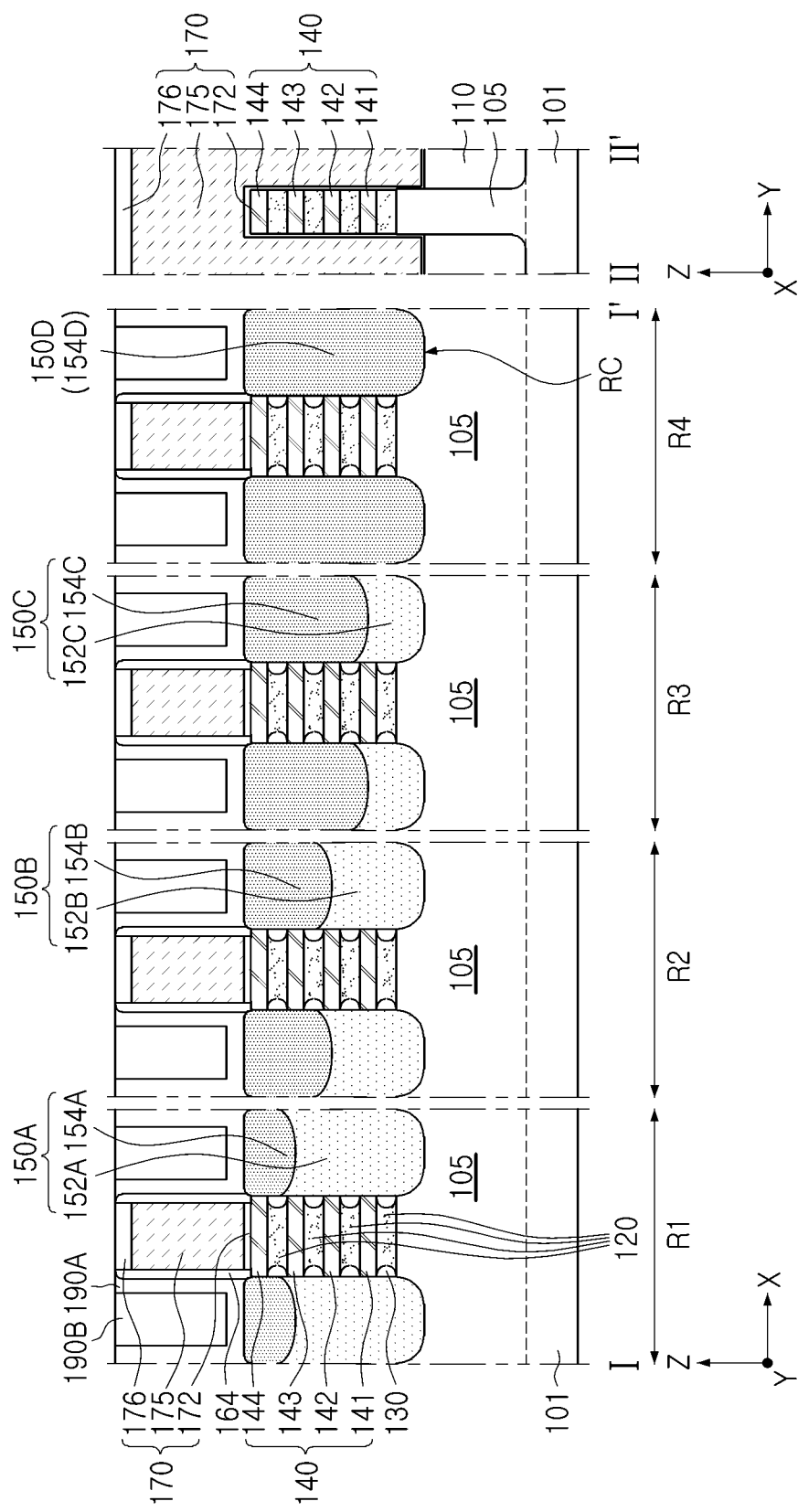

Referring to FIGS. 10B and 11G, in the first to fourth additional recess regions AR1, AR2, AR3, and AR4 from which the preliminary first epitaxial layers 152P are removed, the second epitaxial layers 154A, 154B, 154C, and 154D may be formed (S148).

The second epitaxial layers 154A, 154B, 154C, and 154D may be formed to have different thicknesses to at least partially fill the first to fourth additional recess regions AR1, AR2, AR3, and AR4. The second epitaxial layers 154A, 154B, 154C, and 154D may be formed in the first to fourth regions R1, R2, R3, and R4 through separate processes, respectively. In other embodiments, the second epitaxial layers 154A, 154B, 154C, and 154D may be formed together at least partially. Through this operation, the first to fourth source/drain regions 150A, 150B, 150C, and 150D including the first epitaxial layers 152A, 152B, and 152C and the second epitaxial layers 154A, 154B, 154C, and 154D may be formed in the first to fourth regions R1, R2, R3, and R4.

The second epitaxial layers 154A, 154B, 154C, and 154D may be formed by epitaxial growth from the first epitaxial layers 152A, 152B, and 152C or the active region 105. The second epitaxial layers 154A, 154B, 154C, and 154D may be formed to include, for example, in-situ doped impurities, the impurities may have a conductivity type different from that of impurities of the first epitaxial layers 152A, 152B, and 152C.

Figure 11H:
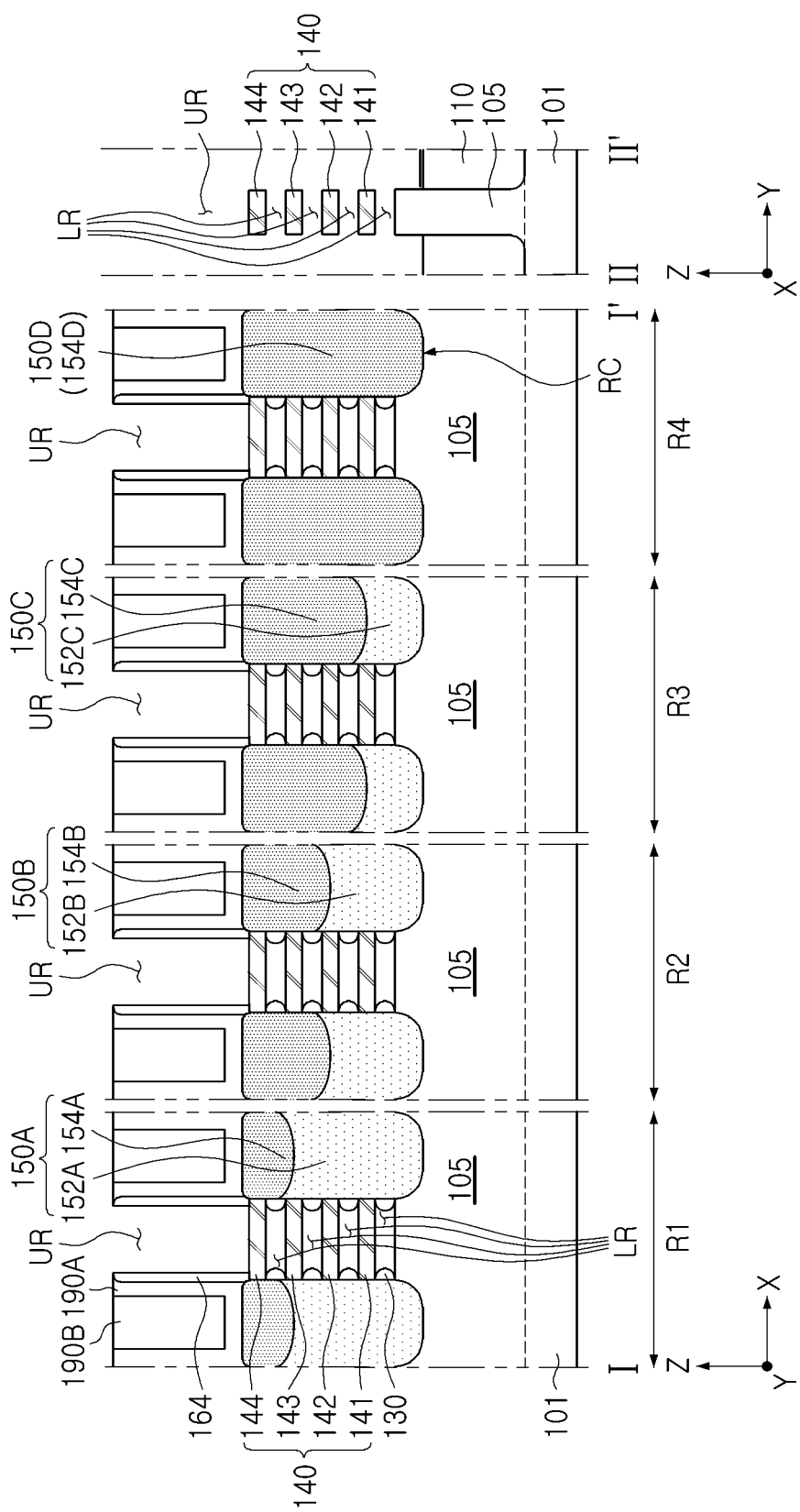

Referring to FIGS. 10A and 11H, after first and second interlayer insulating layers 190A and 190B are formed, the sacrificial layers 120 and the sacrificial gate structures 170 may be removed (S150).

The first and second interlayer insulating layers 190A and 190B may be formed by forming an insulating film on and at least partially covering the sacrificial gate structures 170 and the source/drain regions 150A, 150B, 150C, and 150D and performing a planarization process. The first and second interlayer insulating layers 190A and 190B may be formed of different materials among silicon oxide, silicon nitride, and/or silicon oxynitride. However, according to some embodiments, the first and second interlayer insulating layers 190A and 190B may be formed as a single layer.

The sacrificial layers 120 and the sacrificial gate structures 170 may be selectively removed with respect to the gate spacer layers 164, the first and second interlayer insulating layers 190A and 190B, and the channel structures 140. First, upper gap regions UR are formed by removing the sacrificial gate structures 170, and then the sacrificial layers 120 exposed through the upper gap regions UR may be removed to form lower gap regions LR. For example, when the sacrificial layers 120 include silicon germanium (SiGe) and the channel structures 140 include silicon (Si), the sacrificial layers 120 may be selectively removed by performing a wet etching process using a peracetic acid as an etchant. During the removal process, the source/drain regions 150A, 150B, 150C, and 150D may be protected by the first and second interlayer insulating layers 190A and 190B and the internal spacer layers 130.

Figure 11I:
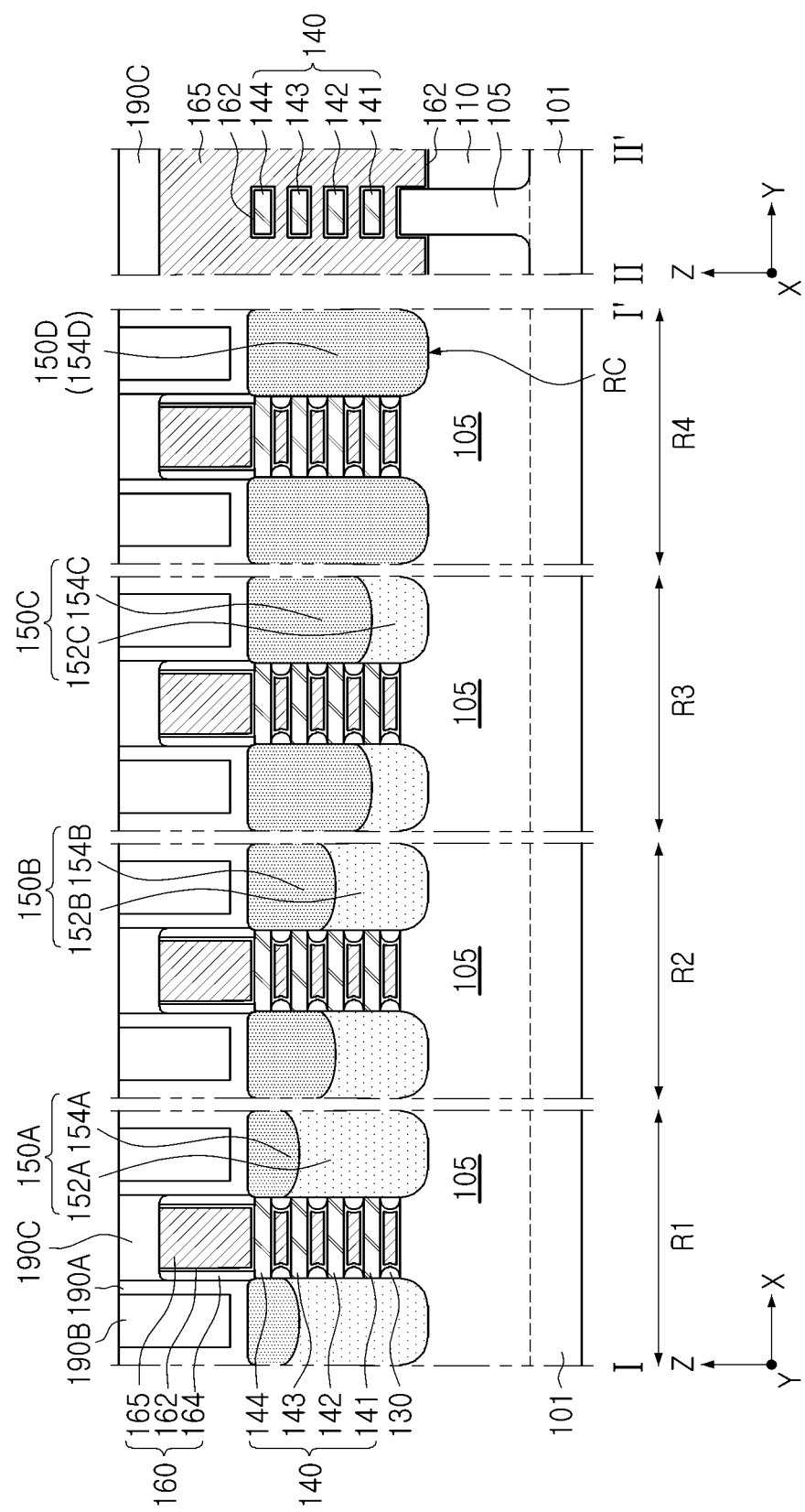

Referring to FIGS. 10A and 11I, gate structures 160 may be formed (S160).

The gate structures 160 may be formed to at least partially fill the upper gap regions UR and the lower gap regions LR. The gate dielectric layers 162 may be formed to conformally cover inner surfaces of the upper gap regions UR and the lower gap regions LR. After the gate electrodes 165 are formed to completely fill the upper gap regions UR and the lower gap regions LR, the gate electrodes 165 may be removed from the upper gap regions UR to a predetermined depth from an upper portion together with the gate dielectric layers 162 and the gate spacer layers 164.

Next, a third interlayer insulating layer 190C may be further formed on the gate structures 160. For example, the third interlayer insulating layer 190C may be formed of the same material as the first interlayer insulating layer 190A.

Figure 11J:
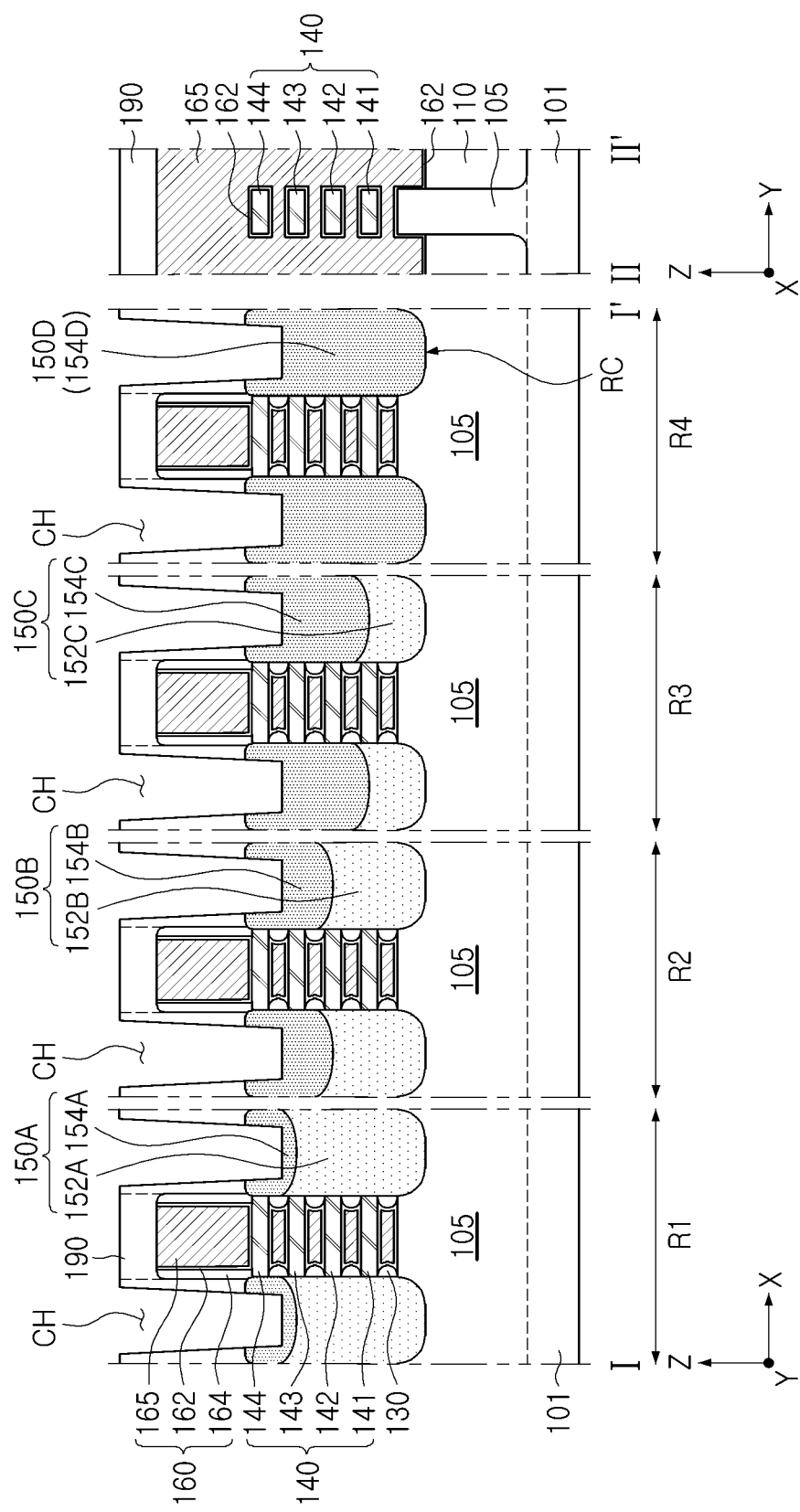
Figure 11K:
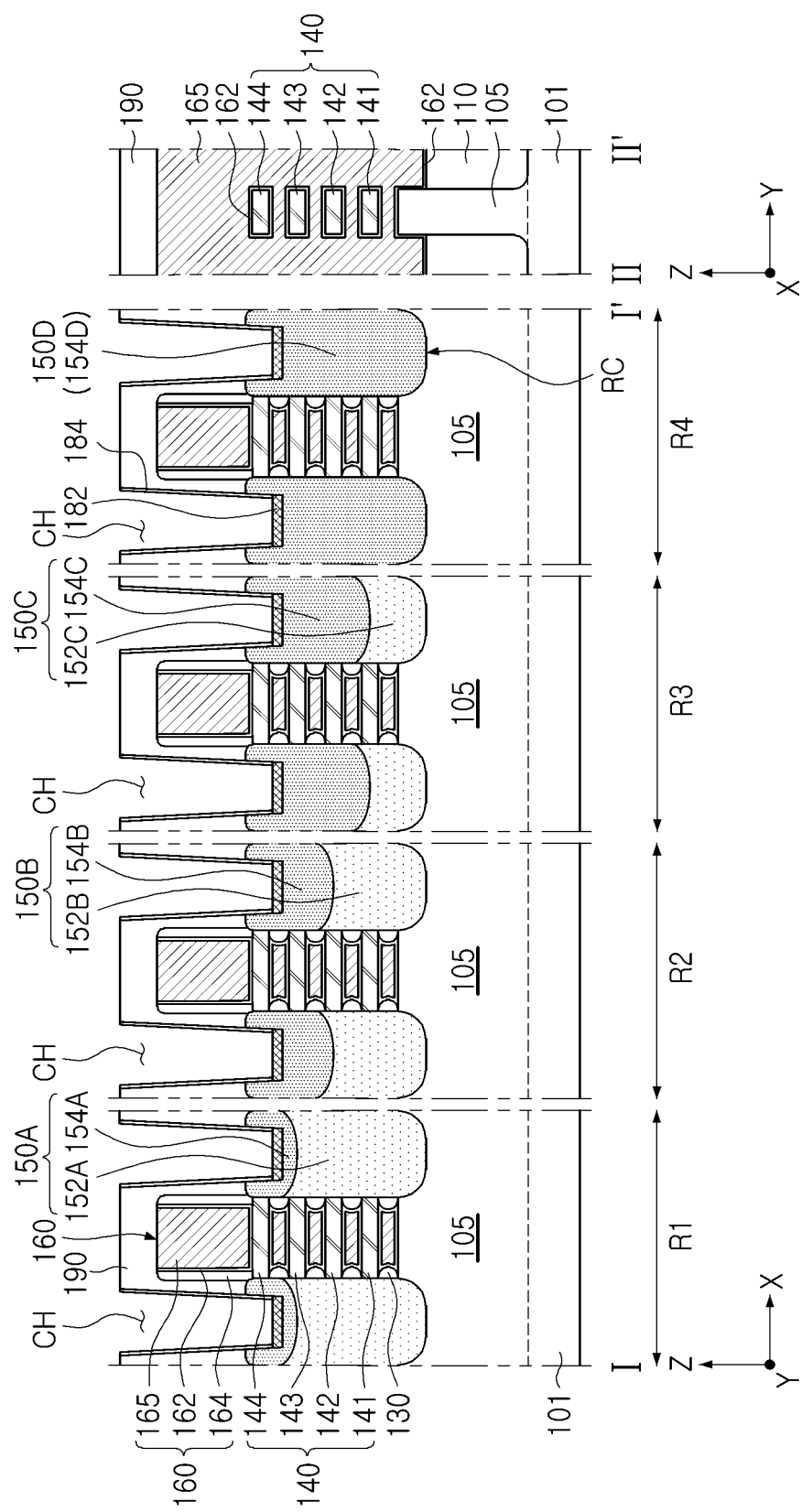

Referring to FIGS. 10A, 11J, and 11K, a contact plug 180 may be formed (S170).

First, as shown in FIG. 11J, contact holes CH exposing the source/drain regions 150A, 150B, 150C, and 150D may be formed. Lower surfaces of the contact holes CH may be recessed into the source/drain regions 150A, 150B, 150C, and 150D or may be formed on upper surfaces of the source/drain regions 150A, 150B, 150C, and 150D.

In an example embodiment, contact holes CH may be formed by removing the second interlayer insulating layer 190B of FIG. 11I in at least some regions and removing the first interlayer insulating layer 190A on the exposed source/drain regions 150A, 150B, 150C, and 150D. Alternatively, in an example embodiment, the contact holes CH may be formed by etching the first and second interlayer insulating layers 190A and 190B through a patterning process. In some embodiments, a portion of the first interlayer insulating layer 190A may remain. Hereinafter, the remaining first to third interlayer insulating layers 190A, 190B, and 190C may be collectively referred to as an interlayer insulating layer 190.

Thereafter, as shown in FIG. 11K, after depositing a material constituting barrier layers 184, a process such as a silicidation process may be performed to form metal-semiconductor compound layers 182 on bottom surfaces of the contact holes CH.

Thereafter, referring to FIG. 2A together, a conductive material may be deposited to at least partially fill the contact holes CH to form plug conductive layers 186. Through this operation, the contact plugs 180 including the metal-semiconductor compound layer 182, the barrier layer 184, and the plug conductive layer 186 may be formed.

As described above, a semiconductor device having improved power efficiency by including source/drain regions having different relative thicknesses of the first and second epitaxial layers may be provided.

While example embodiments have been shown and described above, it will be apparent to those skilled in the art that modifications and variations could be made without departing from the scope of the present inventive concept as defined by the appended claims.

What is claimed is:

1. A semiconductor device comprising:
active regions extending on a substrate in a first direction;
first and second gate structures intersecting the active regions and extending on the substrate in a second direction;
a plurality of channel layers spaced apart from each other in a third direction, perpendicular to an upper surface of the substrate, on the active regions and surrounded in the second and third directions by the first and second gate structures;
first and second source/drain regions in recess regions in which the active regions are recessed on at least one side of each of the first and second gate structures, and physically contacting the plurality of channel layers; and
contact plugs connected to the first and second source/drain regions,
wherein each of the first and second source/drain regions includes:
a first epitaxial layer on each of the active regions in each of the recess regions; and
a second epitaxial layer on the first epitaxial layer and including first conductivity-type impurities,
the first epitaxial layer has a maximum first thickness in the third direction in the first source/drain region, and
the first epitaxial layer has a maximum second thickness less than the maximum first thickness in the third direction in the second source/drain region.

2. The semiconductor device of claim 1, wherein the second epitaxial layer has a first depth in the third direction in the first source/drain region, and the second epitaxial layer has a second depth deeper than the first depth in the third direction in the second source/drain region.

3. The semiconductor device of claim 1, wherein the first and second source/drain regions have substantially a same thickness.

4. The semiconductor device of claim 3, wherein the first and second source/drain regions have upper ends and lower ends respectively positioned at substantially a same height level in the third direction.

5. The semiconductor device of claim 1, wherein a number of the channel layers connected to the second epitaxial layer, among the plurality of channel layers, in the first source/drain region is less than a number of the channel layers connected to the second epitaxial layer, among the plurality of channel layers, in the second source/drain region.

6. The semiconductor device of claim 1, wherein the first epitaxial layer includes a semiconductor material.

7. The semiconductor device of claim 6, wherein the first epitaxial layer includes second conductivity-type impurities.

8. The semiconductor device of claim 7, wherein the first epitaxial layer includes the second conductivity-type impurities at a first concentration, and the second epitaxial layer includes the first conductivity-type impurities at a second concentration higher than the first concentration.

9. The semiconductor device of claim 1, wherein the first epitaxial layer includes at least one of silicon oxide, silicon nitride, or silicon oxynitride.

10. The semiconductor device of claim 9, wherein the first epitaxial layer is a single crystal.

11. The semiconductor device of claim 1, wherein the second epitaxial layer is on side surfaces of at least some of the plurality of channel layers.

12. The semiconductor device of claim 1, wherein the first gate structure constitutes a part of transistors connected in parallel, and
wherein the second gate structure constitutes a part of transistors connected in series.

13. The semiconductor device of claim 1, wherein the contact plugs are each connected to the second epitaxial layer.

14. The semiconductor device of claim 1, further comprising internal spacer layers between the first and second gate structures and the first and second source/drain regions in the first direction.

15. A semiconductor device comprising:
active regions extending on a substrate in a first direction;
gate structures intersecting the active regions and extending on the substrate in a second direction;
source/drain regions in recess regions in which the active regions are recessed, on both sides of each of the gate structures; and
contact plugs connected to the source/drain regions,
wherein each of the source/drain regions includes first and second epitaxial layers sequentially stacked on the active regions in the recess regions in a third direction perpendicular to an upper surface of the substrate, respectively, and
wherein ratios of the first epitaxial layer thickness in the third direction to the second epitaxial layer thickness in the third direction are different in different ones of the source/drain regions.

16. The semiconductor device of claim 15, wherein the second epitaxial layer is doped with first conductivity type impurities, and the first epitaxial layer is not doped with the first conductivity type impurities.

17. The semiconductor device of claim 16, wherein the first epitaxial layer is doped with second conductivity type impurities.

18. The semiconductor device of claim 16, wherein the first epitaxial layer is an insulating layer.

19. A semiconductor device comprising:
active regions extending on a substrate in a first direction;
gate structures intersecting the active regions and extending on the substrate in a second direction;
a plurality of channel layers spaced apart from each other in a third direction, perpendicular to an upper surface of the substrate, on the active regions and surrounded in the second and third directions by the gate structures; and source/drain regions in recess regions in which the active regions are recessed on at least one side of each of the gate structures, wherein each of the source/drain regions includes first and second epitaxial layers sequentially stacked on the active regions in the recess regions in the third direction, respectively, wherein the source/drain regions include a first source/drain region in which the second epitaxial layer is at a maximum first depth and a second source/drain region in which the second epitaxial layer is at a maximum second depth different from the maximum first depth, and wherein the sums of thicknesses of the first and second epitaxial layers in the third direction in the first and second source/drain regions are substantially equal.

20. The semiconductor device of claim 19, wherein the second epitaxial layer includes a first conductivity-type semiconductor, and the first epitaxial layer includes a second conductivity-type semiconductor.

* * * * *